US012777671B2

(12) United States Patent
Tsai et al.

(10) Patent No.: US 12,777,671 B2
(45) Date of Patent: Oct. 27, 2026

(54) ISOLATION STRUCTURES FOR MULTI-GATE DEVICES

(71) Applicant: Taiwan Semiconductor Manufacturing Company, Ltd., Hsinchu (TW)

(72) Inventors: Ya-Yi Tsai, Hsinchu (TW); Chi Yuen Pak, Hsinchu (TW); Bo-Hong Chen, Kaohsiung (TW); Han-Wei Chen, Hsinchu (TW); Yu-Hsien Lin, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 384 days.

(21) Appl. No.: 18/517,945

(22) Filed: Nov. 22, 2023

(65) Prior Publication Data

US 2025/0081512 A1 Mar. 6, 2025

Related U.S. Application Data

(60) Provisional application No. 63/535,843, filed on Aug. 31, 2023.

(51) Int. Cl.
*H01L 29/78* (2006.01)
*H01L 27/088* (2006.01)
(Continued)

(52) U.S. Cl.
CPC ....... *H10D 30/6211* (2025.01); *H10D 30/024* (2025.01); *H10D 30/6735* (2025.01);
(Continued)

(58) Field of Classification Search
CPC ............. H10D 30/6211; H10D 30/024; H10D 30/6735; H10D 62/154; H10D 62/158; H10D 84/834; H10D 84/853; H10D 30/019; H10D 84/0151; H10D 84/0153; H10D 84/832; H10D 30/501; H10D 30/6757; B82Y 10/00
(Continued)

(56) References Cited

U.S. PATENT DOCUMENTS

| | | | |
|---|---|---|---|
| 10,325,912 | B2 | 6/2019 | Chen |
| 11,532,744 | B2 | 12/2022 | Chen |

(Continued)

*Primary Examiner* — Tong-Ho Kim
(74) *Attorney, Agent, or Firm* — HAYNES AND BOONE, LLP

(57) ABSTRACT

A semiconductor structure according to the present disclosure includes a substrate, a first base fin and a second base fin arising from the substrate, an isolation structure disposed between the first base fin and the second base fin, first channel members disposed over the first base fin, second channel members disposed over the second base fin, a region isolation feature extending into the substrate, a first gate structure wrapping around each of the first channel members, second gate structure wrapping around each of the second channel members, a first gate cut feature extending through the first gate structure and into the isolation feature, and a second gate cut feature extending though the second gate structure and into the isolation feature. Each of the first gate cut feature and the second gate cut feature are spaced apart from the region isolation feature.

20 Claims, 19 Drawing Sheets

(51) Int. Cl.

| | |
|---|---|
| ***H01L 27/092*** | (2006.01) |
| ***H01L 29/08*** | (2006.01) |
| ***H01L 29/423*** | (2006.01) |
| ***H01L 29/66*** | (2006.01) |
| ***H10D 30/01*** | (2025.01) |
| ***H10D 30/62*** | (2025.01) |
| ***H10D 30/67*** | (2025.01) |
| ***H10D 62/13*** | (2025.01) |
| ***H10D 84/83*** | (2025.01) |
| ***H10D 84/85*** | (2025.01) |

(52) U.S. Cl.
CPC ......... *H10D 62/154* (2025.01); *H10D 62/158* (2025.01); *H10D 84/834* (2025.01); *H10D 84/853* (2025.01)

(58) Field of Classification Search
USPC .......................................................... 257/401
See application file for complete search history.

(56) References Cited

U.S. PATENT DOCUMENTS

| | | | | |
|---|---|---|---|---|
| 2019/0131297 | A1* | 5/2019 | Chen | H01L 21/76229 |
| 2020/0411661 | A1* | 12/2020 | Guler | H10D 30/014 |
| 2021/0183855 | A1* | 6/2021 | Ng | H10D 62/121 |
| 2022/0068721 | A1 | 3/2022 | Yang | |
| 2022/0328360 | A1 | 10/2022 | Huang | |
| 2022/0359506 | A1 | 11/2022 | Ng | |

* cited by examiner

ISOLATION STRUCTURES FOR MULTI-GATE DEVICES

PRIORITY DATA

This application claims priority to U.S. Provisional Patent Application No. 63/535,843, filed on Aug. 31, 2023, which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high performance and low leakage applications. A GAA transistor has a gate structure that can extend, partially or fully, around a channel region to provide access to the channel region on two or more sides. Because its gate structure surrounds the channel regions, a GAA transistor may also be referred to as a surrounding gate transistor (SGT). Because the channel region of an GAA transistor may include nanowires or nanosheets and its configuration resembles a bridge, a GAA transistor may also be referred to a multi-bridge-channel (MBC) transistor, a nanowire transistor, or a nanosheet transistor. The nanosheets and nanowires may be generally referred to as nanostructures.

Dielectric isolation features are used to isolate IC device features that would otherwise come in contact with one another. Depending on their applications, dielectric isolation features may have different shapes and characteristics.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
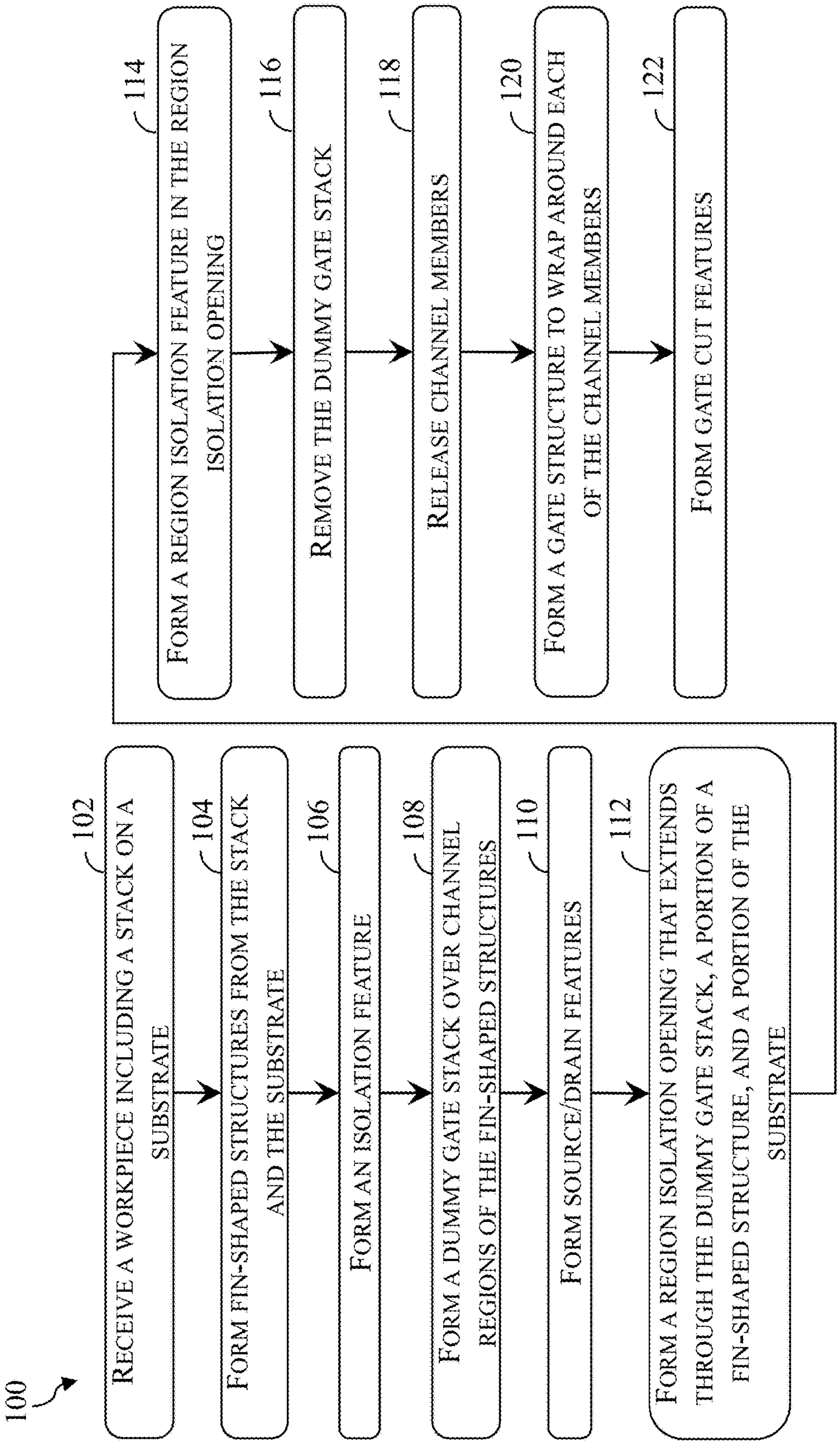
FIG. 1 illustrates a flowchart of a method for forming a semiconductor structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with “about,” “approximate,” and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of “about 5 nm” can encompass a dimension range from 4.25 nm to 5.75 nm where manufacturing tolerances associated with depositing the material layer are known to be +/−15% by one of ordinary skill in the art.

To ensure functionality of IC devices, different types of dielectric isolation features are formed to separate structures that are otherwise connected. For example, a region isolation feature may be formed to selectively remove a portion of an active region to divide an active region in two regions. In some instances, a region isolation feature may be referred to as a continuous poly on diffusion edge (CPODE) feature. The use of CPODE features allows reduction of contacted poly pitch (CPP) and dimensional reduction of standard cells. For another example, a gate cut feature may be formed to divide a gate structure into two gate segments. A gate cut feature is usually elongated and may cut through more than one gate structures that extend parallel to one another. Both the region isolation features and the gate cut features may be formed before or after formation of a high-k metal gate structure.

The present disclosure provides processes to form region isolation features and gate cut features to improve yield and provide a balanced performance of the resulting devices. In some embodiments, a region isolation feature is formed before a dummy gate stack is replaced with a high-k metal gate structure such that a gate dielectric layer of the high-k metal gate structure ends up extending along sidewalls of the region isolation feature. Gate cut features are formed after the dummy gate stack is replaced with the high-k metal gate structure. As a result, the gate dielectric layer of the high-k metal gate structure does not extend along sidewalls of the gate cut features. To prevent uneven etching due to the slow etching of the gate dielectric layer, widths of the region isolation feature and gate cut features are selected such that the formation of the gate cut features does not involve etching the gate dielectric layer disposed along sidewalls of the region isolation feature. Processes of the present disclosure ensure uniform gate cut feature profiles. Uneven gate cut feature profiles may cause variation in gate structures, resulting in unpredictable threshold voltage and switching characteristics.

The various aspects of the present disclosure will now be described in more detail with reference to the figures. FIG. 1 illustrate a flowchart of a method 100 of forming a semiconductor structure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-19, which illustrate fragmentary cross-sectional views and top views of a workpiece 200 at different stages of fabrication according to embodiments of method 100. Because a semiconductor structure will be formed from the workpiece 200, the workpiece 200 may be referred to as a semiconductor structure 200 as the context requires. Throughout FIG. 2-19, the X direction, the Y direction, and the Z direction are perpendicular to one another and are used consistently. For example, the X direction in one figure is parallel to the X direction in a different figure. Additionally, throughout the present disclosure, like reference numerals are used to denote like features.

Figure 2:
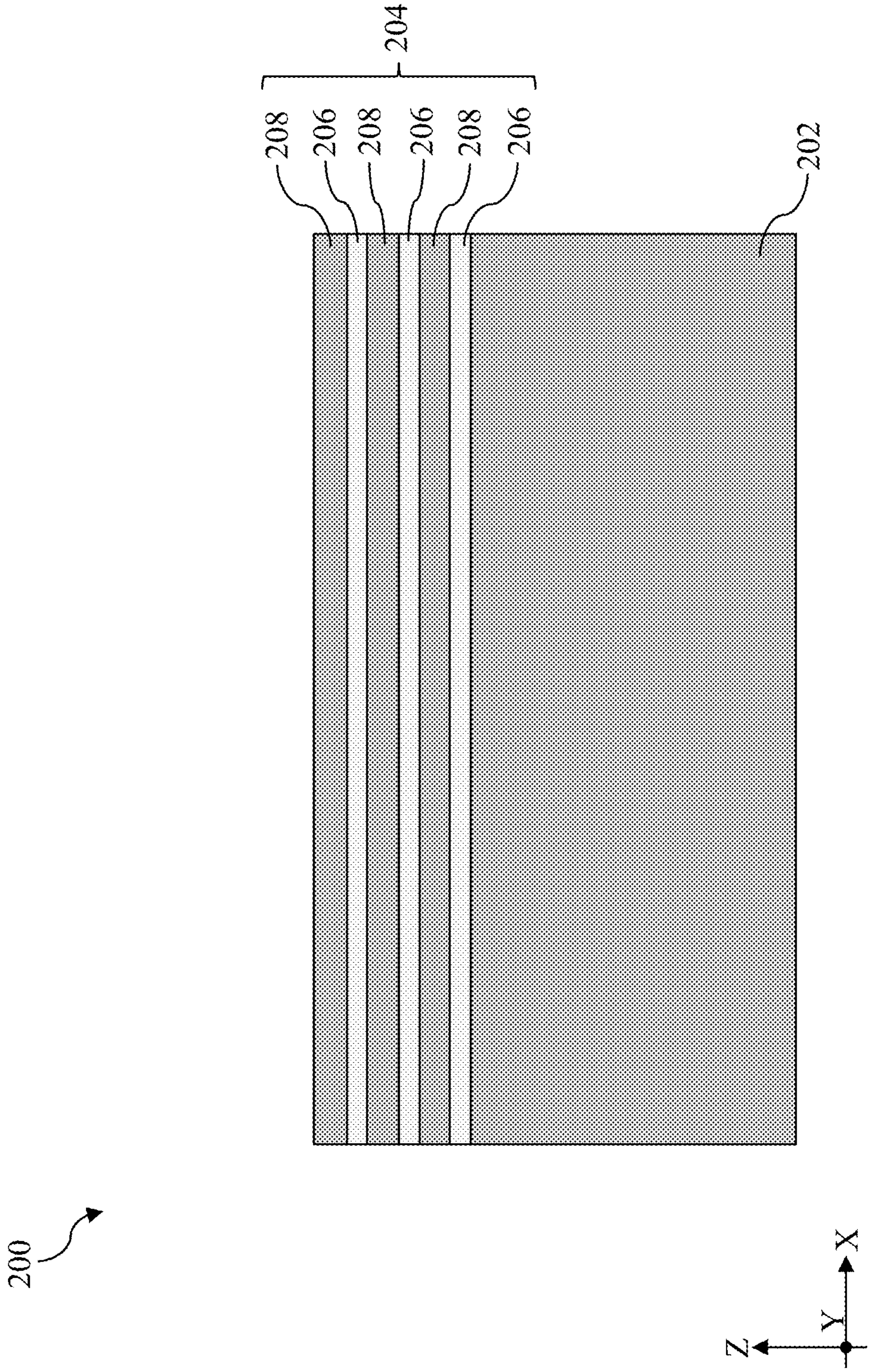
FIGS. 2-19 illustrate fragmentary cross-sectional views of a workpiece during various fabrication stages in the method of FIG. 1, according to one or more aspects of the present disclosure.

Referring to FIGS. 1 and 2, method 100 includes a block 102 where a workpiece 200 is received. As shown in FIG. 2, the workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GeOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping of the n-type wells and the p-type wells may be formed using ion implantation or thermal diffusion.

Referring still to FIG. 2, the stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. The stack 204 shown in FIG. 2 includes three (3) layers of the sacrificial layers 206 and three (3) layers of the channel layers 208, which is for illustrative purposes only and not intended to be limiting beyond what is specifically recited in the claims. The number of layers in the stack 204 depends on the desired number of channels members for the semiconductor device 200. In some embodiments, the number of the channel layers 208 is between 2 and 10.

Figure 3:
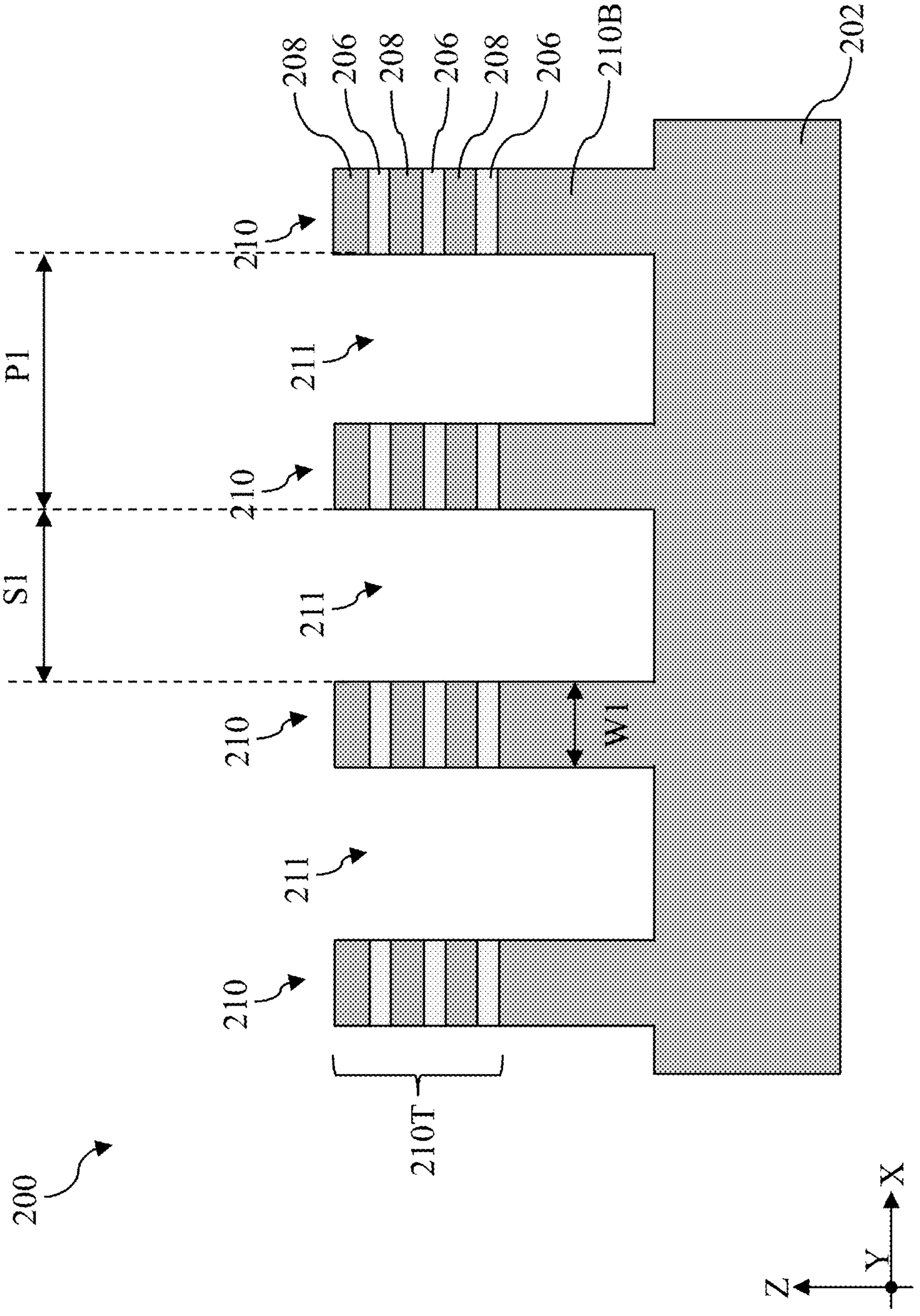

Referring to FIGS. 1 and 3, method 100 includes a block 104 where fin-shaped structure 210 are formed. In some embodiments, at block 104, the stack 204 and a portion of the substrate 202 are patterned to form the fin-shaped structures 210 that are defined by trenches 211. As shown in FIG. 3, each of the fin-shaped structures 210 includes a base portion 210B formed from a portion of the substrate 202 and a top portion 210T formed from the stack 204. The top portion 210T is disposed over the base portion 210B. The fin-shaped structures 210 extend lengthwise along the Y direction and extend vertically along the Z direction from the substrate 202. The fin-shaped structures 210 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a hard mask layer is first deposited over the stack 204 and then a material layer is formed over the hard mask. The material layer is patterned using a photolithography process. Spacers are formed alongside the patterned material layer using a self-aligned process. The material layer is then removed, and the remaining spacers, or mandrels, may then be used to pattern the hard mask layer and then the patterned hard mask layer may be used to pattern the fin-shaped structures 210 by etching the stack 204 and the substrate 202. The etching process can include dry etching, wet etching, reactive ion etching (RIE), and/or other suitable processes. As shown in FIG. 3, in some embodiments, the fin-shaped structures 210 are disposed at a first pitch P1, which is a sum of a first spacing S1 between two adjacent fin-shaped structures 210 and a first width W1 of a fin-shaped structure 210 along the X direction. In some implementations, the first width W1 may be between about 5 nm and about 100 nm and the first spacing S1 may be between about 20 nm and about 200 nm. The first pitch P1 may be between about 25 nm and about 300 nm.

Figure 4:
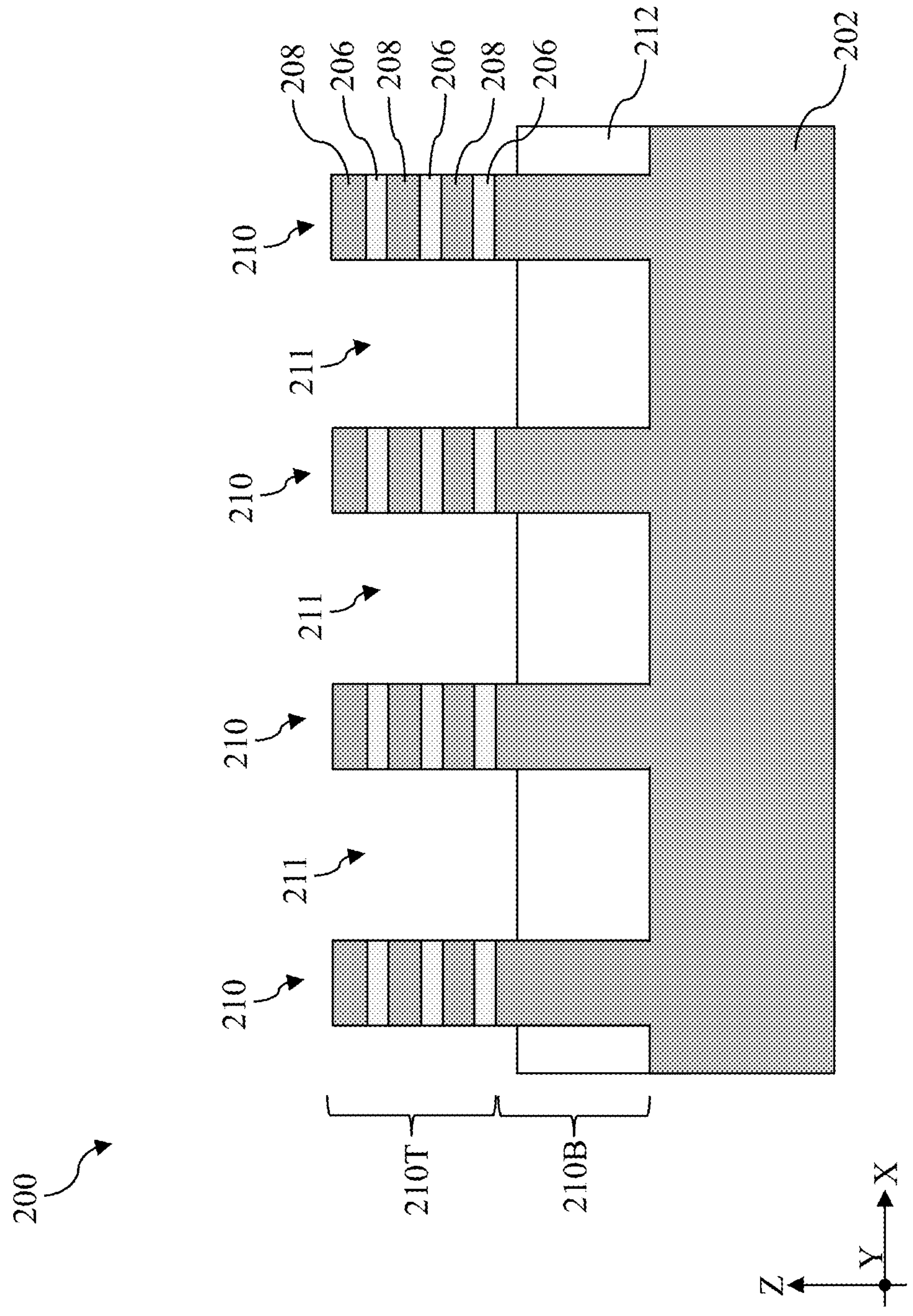

Referring to FIGS. 1 and 4, method 100 includes a block 106 where an isolation feature 212 is formed. After the fin-shaped structures 210 are formed, the isolation feature 212 shown in FIG. 4 is formed between neighboring fin-shaped structures 210. The isolation feature 212 may also be referred to as a shallow trench isolation (STI) feature 212. In an example process, a dielectric material for the isolation feature 212 is first deposited over the workpiece 200, filling the trenches 211 between fin-shaped structures 210 with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a flowable CVD (FCVD) process, spin-on coating, and/or other suitable process. The deposited dielectric material is then thinned and planarized, for example by a chemical mechanical polishing (CMP) process, until at least a portion of fin-shaped structures 210 are exposed. The planarized dielectric material is further recessed by a dry etching process, a wet etching process, and/or a combination thereof to form the isolation feature 212. As shown in FIG. 4, the top portions 210T of the fin-shaped structures 210 rise above the isolation feature 212 while the base portions 210B are surrounded by the isolation feature 212.

Figure 5:
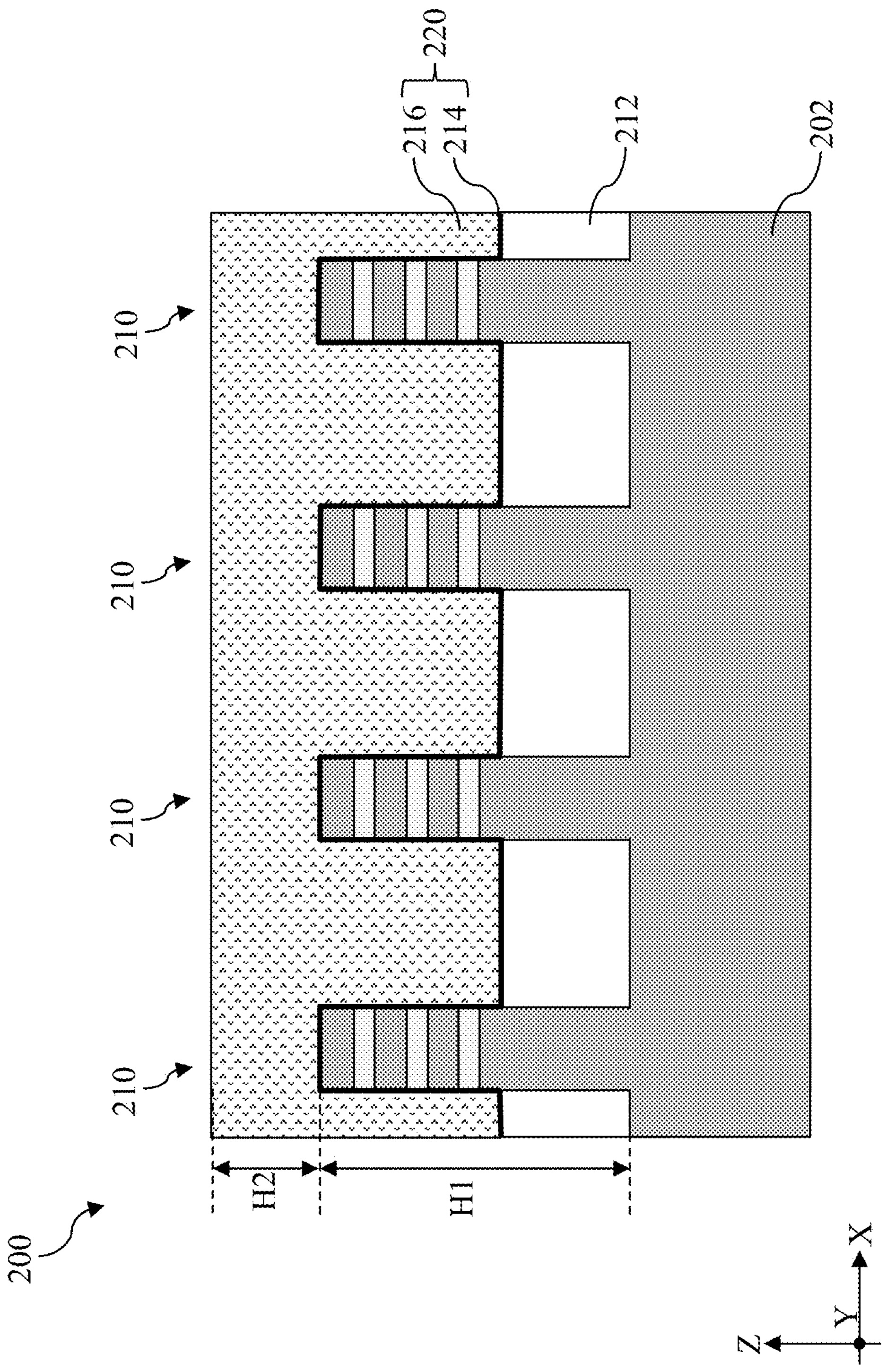

Referring to FIGS. 1 and 5, method 100 includes a block 108 where a dummy gate stack 220 is formed over the fin-shaped structures 210. In some embodiments, a gate replacement process (or gate-last process) is adopted where the dummy gate stack 220 serves as a placeholder for a functional gate structure. Other processes and configuration are possible. In some embodiments represented in FIG. 5, the dummy gate stack 220 includes a dummy dielectric layer 214 and a dummy electrode 216 disposed over the dummy dielectric layer 214. The regions of the fin-shaped structures 210 underlying the dummy gate stack 220 may be referred to as channel regions. Each of the channel regions in a fin-shaped structure 210 is sandwiched along the Y direction between two source/drain regions for source/drain formation. In an example process, the dummy dielectric layer 214 is blanketly deposited over the workpiece 200 by CVD. In this example process, the dummy dielectric layer 214 is deposited over a top surface of the isolation feature 212 and exposed surfaces of the fin-shaped structures 210. A material layer for the dummy electrode 216 is then blanketly deposited over the dummy dielectric layer 214. The dummy dielectric layer 214 and the material layer for the dummy electrode 216 are then patterned using photolithography processes to form the dummy gate stack 220. In some embodiments, the dummy dielectric layer 214 may include silicon oxide and the dummy electrode 216 may include polycrystalline silicon (polysilicon).

As shown in FIG. 5, as measured from a top surface of the substrate 202, each of the fin-shaped structure 210 has a first height H1. The dummy gate stack 220 may have a second height H2 as measured from a top surface of the fin-shaped structure 210. In some embodiments, the first height H1 may be between about 10 nm and about 200 nm and the second height may be between about 10 nm and about 200 nm.

While not explicitly shown in FIGS. 2-14, after the formation of the dummy gate stack 220, dielectric material for at least one gate spacer 222 (shown in FIG. 15) is formed over the workpiece 200, including along sidewalls of the dummy gate stacks 220. The at least one gate spacer 222 may include two or more gate spacer layers. Dielectric materials for the at least one gate spacer 222 may be selected to allow selective removal of the dummy gate stack. Suitable dielectric materials for the at least one gate spacer 222 may include silicon nitride, silicon oxycarbonitride, silicon carbonitride, silicon oxide, silicon oxycarbide, silicon carbide, silicon oxynitride, and/or combinations thereof. In an example process, the at least one gate spacer may be conformally deposited over the workpiece 200 using CVD, subatmospheric CVD (SACVD), or ALD. The at least one gate spacer 222 will remain in the final structure after the dummy gate stack 220 is removed and replaced with a functional gate structure. Reference is now briefly made to FIG. 15, which is fragmentary top view of the workpiece 200 where the dummy gate stack 220 has been replaced with a gate structure 250. As shown in FIG. 15, the at least one gate spacer 222 remain disposed along sidewall of the gate structure 250.

Referring to FIGS. 1 and 5, method 100 includes a block 110 where source/drain features 236 are formed. Operations at block 110 include recessing of the source/drain regions of the fin-shaped structures 210 to form source/drain recesses, formation of inner spacer features, deposition of source/drain features 236 (shown in FIG. 15) in the source/drain recesses, and deposition of an interlayer dielectric layer 232 (shown in FIG. 15) over the source/drain features 236. With the dummy gate stack 220 and the at least one gate spacer 222 (shown in FIG. 15) serving as an etch mask, the workpiece 200 is anisotropically etched to form the source/drain recesses over the source/drain regions of the fin-shaped structures 210. The anisotropic etch at block 110 may include a dry etch process or a suitable etch process. For example, the dry etch process may implement an oxygen-containing gas, hydrogen, a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Although not specifically shown in figures, operations at block 110 also include formation of inner spacer features to interleave the channel layers 208. After the formation of the source/drain recesses, the sacrificial layers 206 exposed in the source/drain recesses are first selectively and partially recessed to form inner spacer recesses, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include APM etch (e.g., ammonia hydroxide-hydrogen peroxide-water mixture). After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features.

Operations at block 110 also includes deposition of source/drain features 236 (shown in dotted lines in FIG. 15 because they are covered under an interlayer dielectric (ILD) layer 232) in the source/drain recesses. In some embodiments, the source/drain features 236 may be selectively and epitaxially deposited on the exposed semiconductor surfaces of the channel layers 208 and the substrate 202. The source/drain features 236 may be deposited using an epitaxial process, such as vapor-phase epitaxy (VPE), ultra-high vacuum CVD (UHV-CVD), molecular beam epitaxy (MBE), and/or other suitable processes. The source/drain features 236 may be either n-type or p-type. When the source/drain features 236 are n-type, it may include silicon (Si) and may be doped with an n-type dopant, such as phosphorus (P) or arsenic (As). When the source/drain features 236 are p-type, it may include silicon germanium (SiGe) or germanium (Ge) and may be doped with a p-type dopant, such as boron (B) or boron difluoride ($BF_2$). Doping of the source/drain features 236 may be performed either in situ with their deposition or ex situ using an implantation process, such as a junction implant process. While not explicitly shown in the figures, the source/drain features 236 may include multiple epitaxial layers with different doping concentrations.

After the deposition of the source/drain features 236 over the source/drain regions of the fin-shaped structures 210, block 110 includes operations to deposit an ILD layer 232 (shown in FIG. 15) over the source/drain features 236. The ILD layer 232 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 232 may be deposited by spin-on coating, an FCVD process, or other suitable deposition technique. After the deposition of the ILD layer 232, a planarization process (such a chemical mechanical polishing (CMP) process) may be performed to the workpiece 200 to provide a planar top surface that exposes the dummy gate stack 220. In some embodiments not explicitly shown in the figures, a contact etch stop layer (CESL) may be conformally deposited over the workpiece 200 and the source/drain features 236 before the deposition of the ILD layer 232. In those embodiments, the CESL may include silicon nitride and may be deposited using ALD or CVD.

Figure 6:
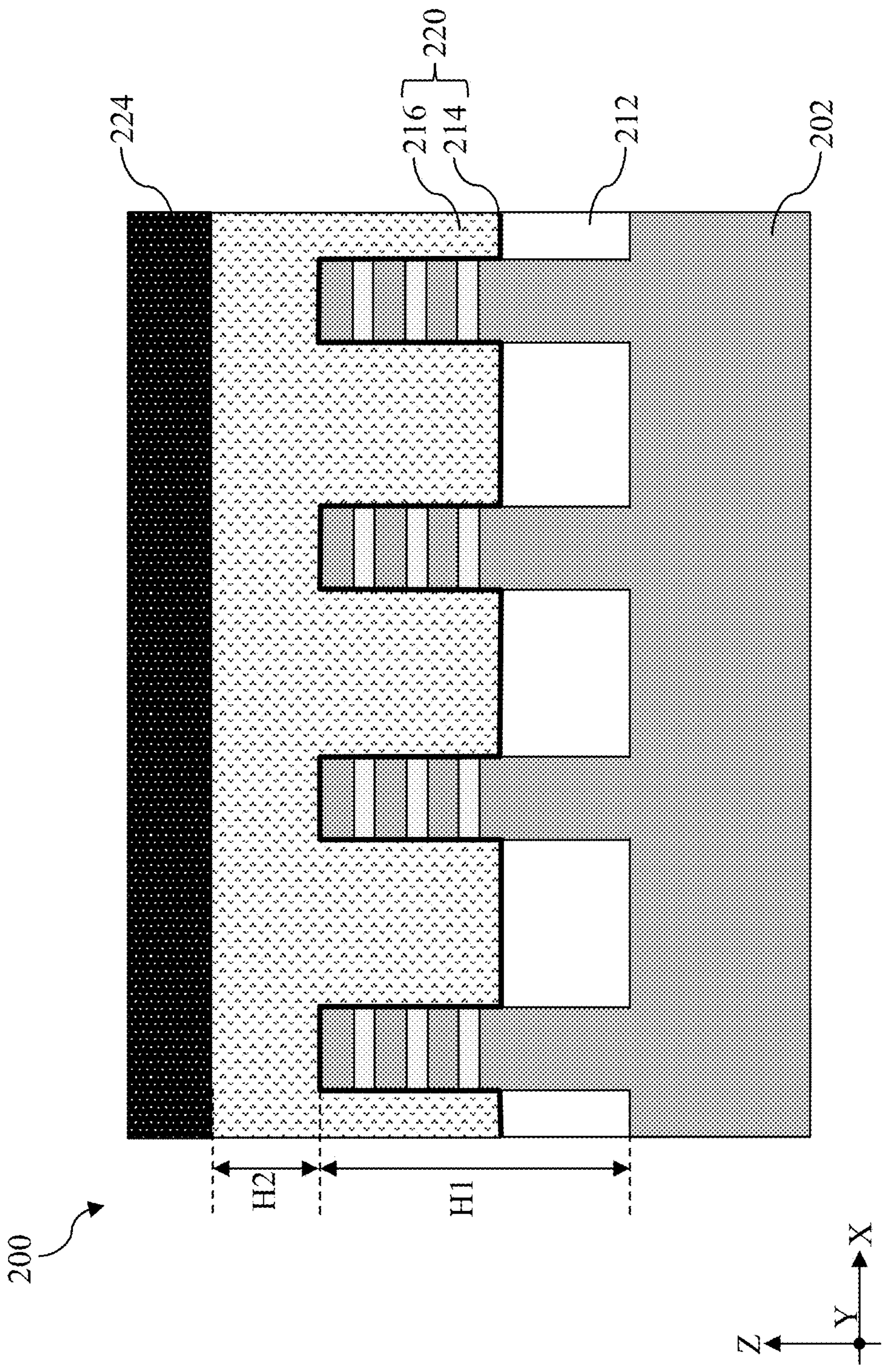
Figure 7:
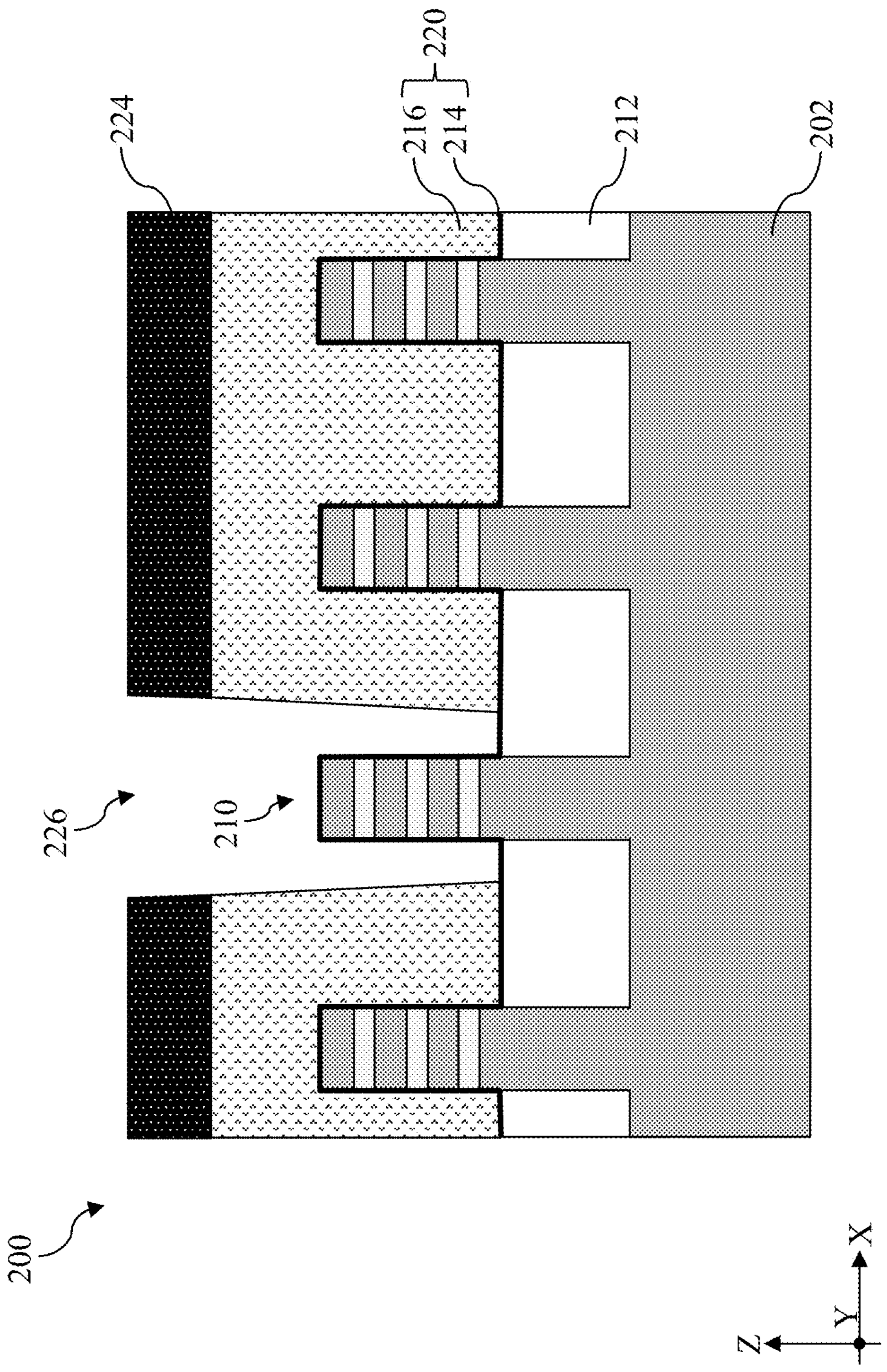

Referring to FIGS. 1 and 6-8, method 100 includes a block 112 where a region isolation opening 2260 is formed. Operations at block 112 may include deposition of a first hard mask layer 224 over the dummy gate stack 220 (shown in FIG. 6), formation of a first opening 226 to expose a fin-shaped structure 210 (shown in FIG. 7), and extension of the first opening 226 into the exposed fin-shaped structure 210 (shown in FIG. 8). Reference is first made to FIG. 6. The first hard mask layer 224 may include silicon oxide, silicon nitride, silicon carbide, silicon oxycarbonitride, or silicon oxynitride and may be deposited using CVD or a suitable method. The first hard mask layer 224 may be patterned using a combination of photolithography and etching processes. After the first hard mask layer 224 is patterned, the patterned first hard mask layer 224 may be applied as an etch mask to etch the dummy electrode 216 to form the first opening 226. In some embodiments, the etching of the dummy electrode 216 may be a dry etching process that includes use of reaction gas and a polymer gas. The reaction gas may include chlorine ($Cl_2$), hydrogen bromide (HBr), tetrafluoromethane ($CF_4$), or hydrogen ($H_2$) or other gas species that can react with the dummy electrode 216. The polymer gas refers to a gas species that can form byproducts during the etching step to form a passivation layer. An example polymer gas includes nitrogen ($N_2$), oxygen ($O_2$), or carbon dioxide ($CO_2$). The use of polymer gases causes redeposition of byproducts, thereby slowing down the etching process. In some embodiments, the dry etch process may include a plasma source that has a source power between about 50 W and about 800 W. Additionally, the dry etch process may include a bias power between 0 W and about 800 W, a pressure between 3 mTorr and about 80 mTorr, and a process temperature between about 20° C. and about 60° C. As shown in FIG. 7, the dry etch process to form the first opening 226 may be selective to the dummy electrode 216 and substantially slow down when it reaches the dummy dielectric layer 214 on the fin-shaped structure 210 and the isolation feature 212. In this sense, the dummy dielectric layer 214 serves as an etch stop layer. In some embodiments, in order to provide a straight sidewall profile for the first opening 226, a cyclic etch process that includes alternating etching cycles and oxidation cycles may be adopted. In some implementations, despite the cyclic etching processes, sidewalls of the first opening 226 may be tapered downward.

Figure 8:
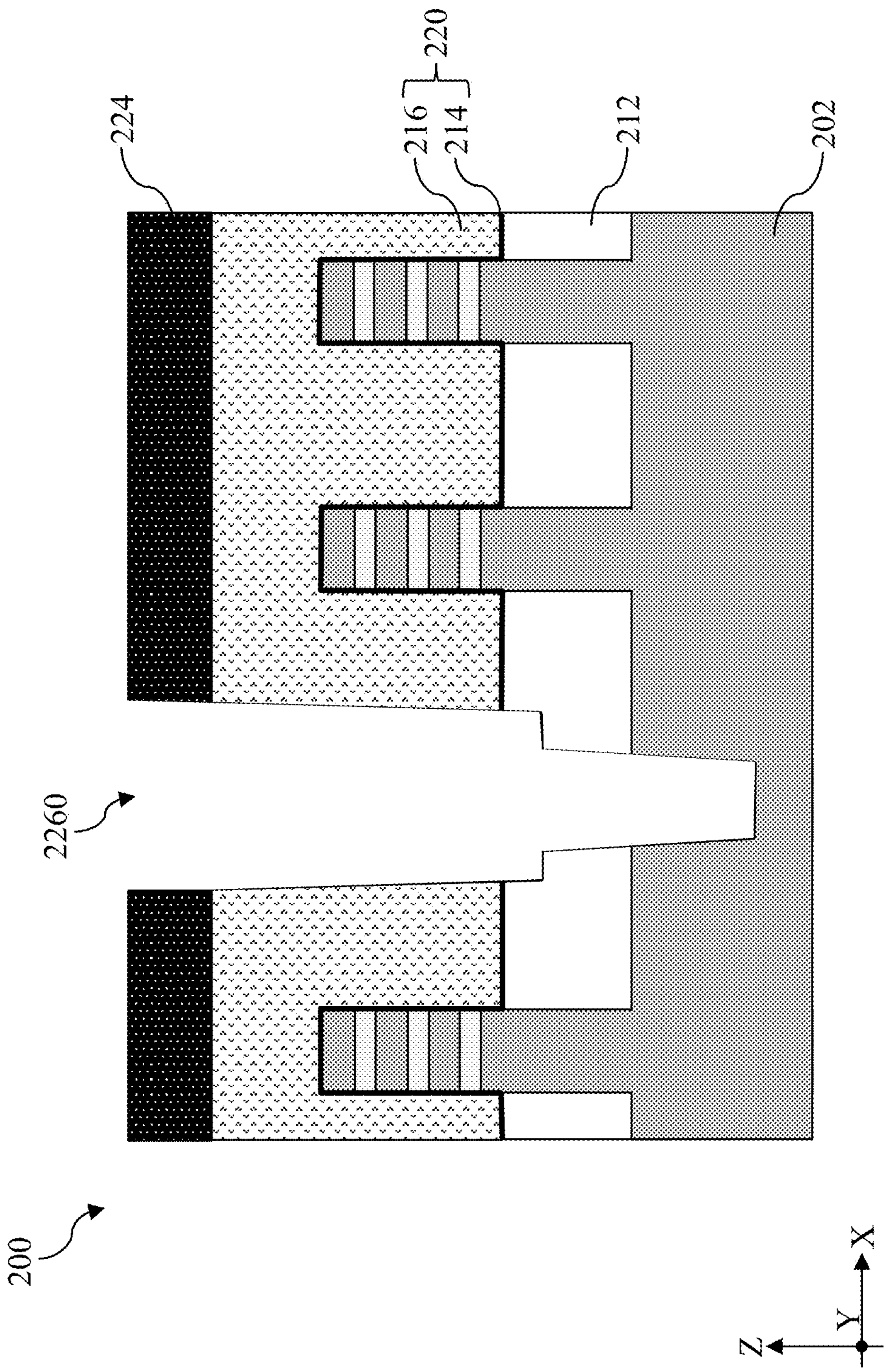

Reference is now made to FIG. 8. A dry etch process different from that used to form the first opening 226 may be performed to extend the first opening 226 downward along the depth of the fin-shaped structure 210 to form a second opening 2260. In some embodiments, the dry etching process for extending the first opening 226 includes use of reaction gas and a polymer gas. The reaction gas may include chlorine ($Cl_2$), hydrogen bromide (HBr), tetrafluoromethane ($CF_4$), hexafluorobutadiene ($C_4H_6$), hydrogen ($H_2$), or nitrogen trifluoride ($NF_3$). The polymer gas refers to a gas species that can form byproducts during the etching step to form a passivation layer. An example polymer gas includes nitrogen ($N_2$), oxygen ($O_2$), or carbon dioxide ($CO_2$), methane ($CH_4$), silicon tetrachloride ($SiCl_4$), or sulfur dioxide ($SO_2$). In some embodiments, the dry etch process to form the second opening 2260 may include a plasma source that has a source power between about 0 W and about 1500 W. Additionally, the dry etch process may include a bias power between 0 W and about 800 W, a pressure between 3 mTorr and about 100 mTorr, and a process temperature between about 20° C. and about 100° C. In some embodiments, the etching processes to form the first opening 226 and the second opening 2260 are performed in different etch systems (or etchers). As shown in FIG. 8, the dry etch process to form the second opening 2260 may be selective to the base portion 210B such that the second opening 2260 experience a step change in width. In some other embodiments, the dry etch process to form the second opening 2260 may be less selective to the base portion 210B and may etch more of the isolation feature 212 or even the substrate 202. As a result, the sidewalls of the second opening 2260 may be substantially continuous and are not characterized by a step change in width along the X direction. The second opening 2260 may also be referred to as the region isolation opening 2260.

Figure 9:
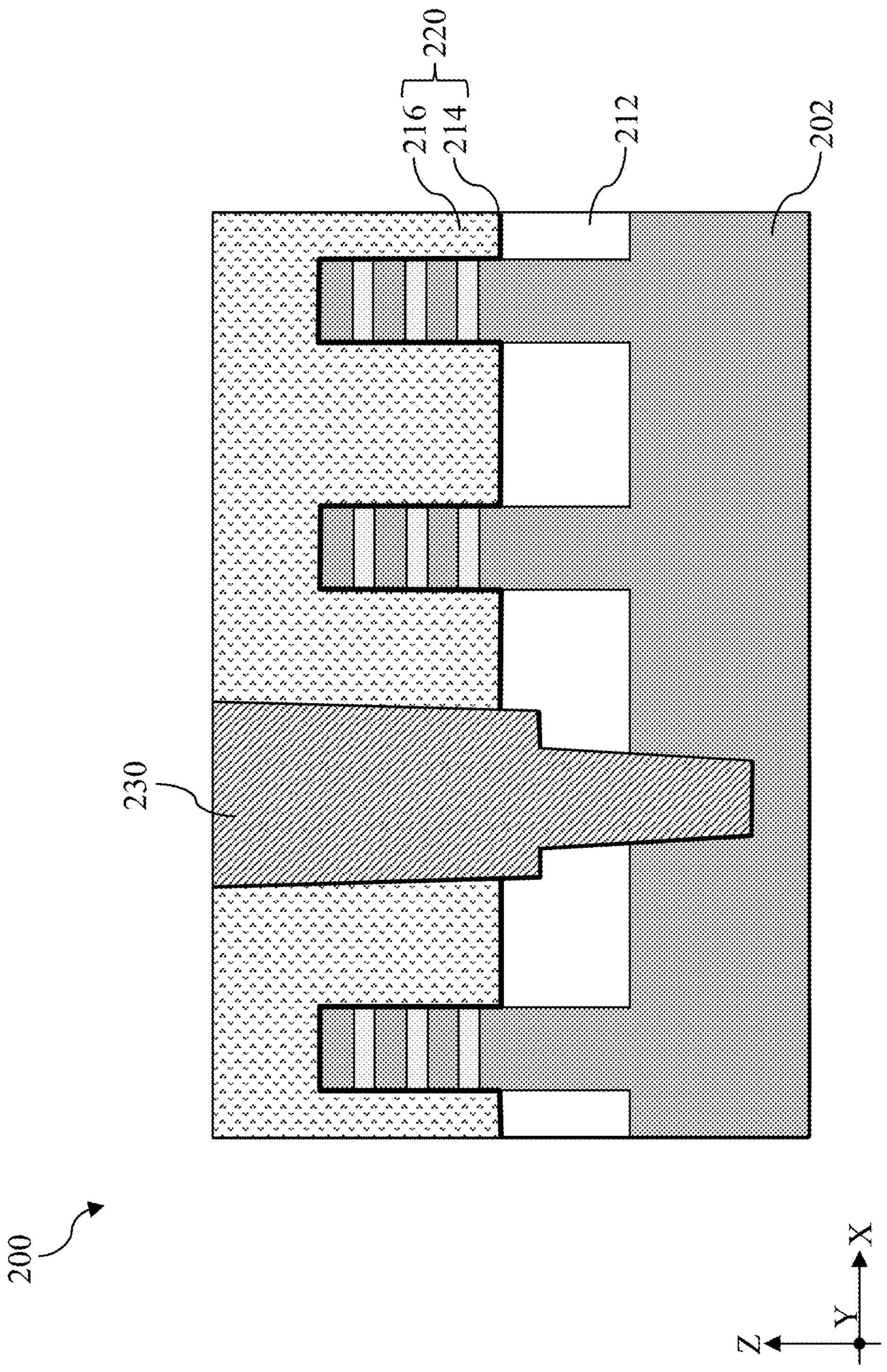

Referring to FIGS. 1 and 9, method 100 includes a block 114 where a region isolation feature 230 is formed in the second opening 2260. At block 114, a dielectric material for the region isolation feature 230 is deposited over the second opening 2260 by plasma enhanced CVD (PECVD), atomic layer deposition (ALD), low-pressure CVD (LPCVD), or CVD. In some embodiments, the dielectric material may include silicon oxide, silicon nitride, silicon oxynitride, silicon oxycarbonitride, or a suitable dielectric material. After the deposition of the dielectric material for the region isolation feature 230, a planarization process, such as a chemical mechanical polishing (CMP) process, may be performed to form the region isolation feature 230 and to remove excess materials, including the patterned first hard mask layer 224.

Figure 10:
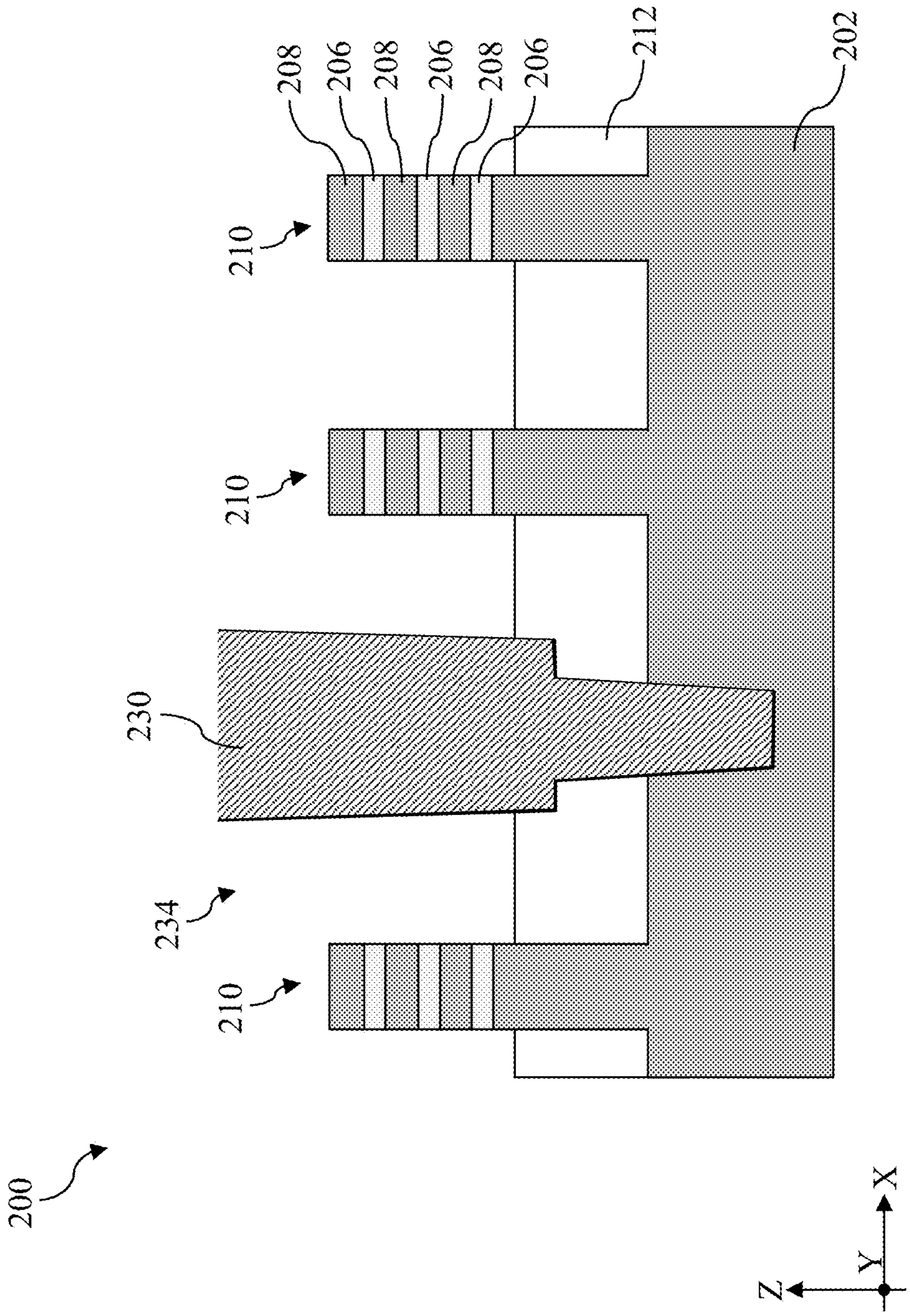

Referring to FIGS. 1 and 10, method 100 includes a block 116 where the dummy gate stack 220 is removed. After the formation of the region isolation feature 230, the exposed dummy gate stack 220 is removed from the workpiece 200 by a selective etch process. The selective etch process may be a selective wet etch process, a selective dry etch process, or a combination thereof. In the depicted embodiments, the selective etch process selectively removes the dummy dielectric layer 214 and the dummy electrode 216 without substantially damaging the at least one gate spacer 222 (shown in FIG. 15), the region isolation feature 230 and the channel regions of the fin-shaped structures 210 that is not removed during the formation of the region isolation feature 230. The removal of the dummy gate stack 220 results in a gate trench 234 over the channel regions of the fin-shaped structures 210. The gate trenches 234 are defined by the at least one gate spacer 222 (shown in FIG. 15) along the Y direction.

Figure 11:
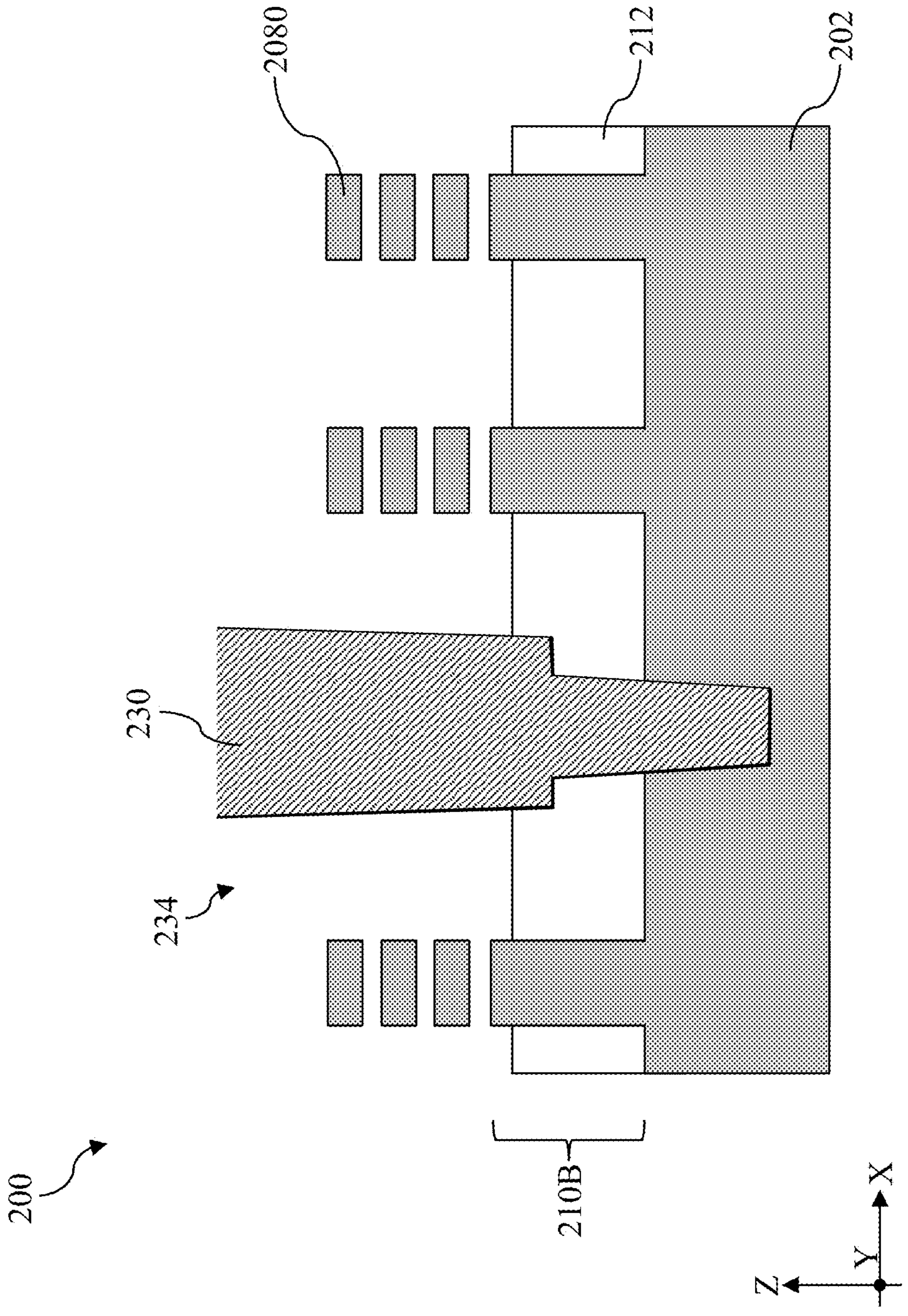

Referring to FIGS. 1 and 11, method 100 includes a block 118 where the channel members 2080 are released from the sacrificial layers 206. After the removal of the dummy gate stack 220, channel layers 208 and sacrificial layers 206 in the channel region are exposed in the gate trenches 234, as shown in FIG. 10. The exposed sacrificial layers 206 between the channel layers 208 may be selectively removed to release the channel layers 208 to form channel members 2080, shown in FIG. 11. The channel members 2080 are vertically stacked, one over another, along the Z direction and are vertically spaced from one another by the space left behind by the removal of the sacrificial layers 206. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. With the removal of the sacrificial layers 206 in the channel region, the channel members 2080 and the top surface of the base portion 210B, and the isolation feature 212 are exposed in the gate trenches 234.

Figure 12:
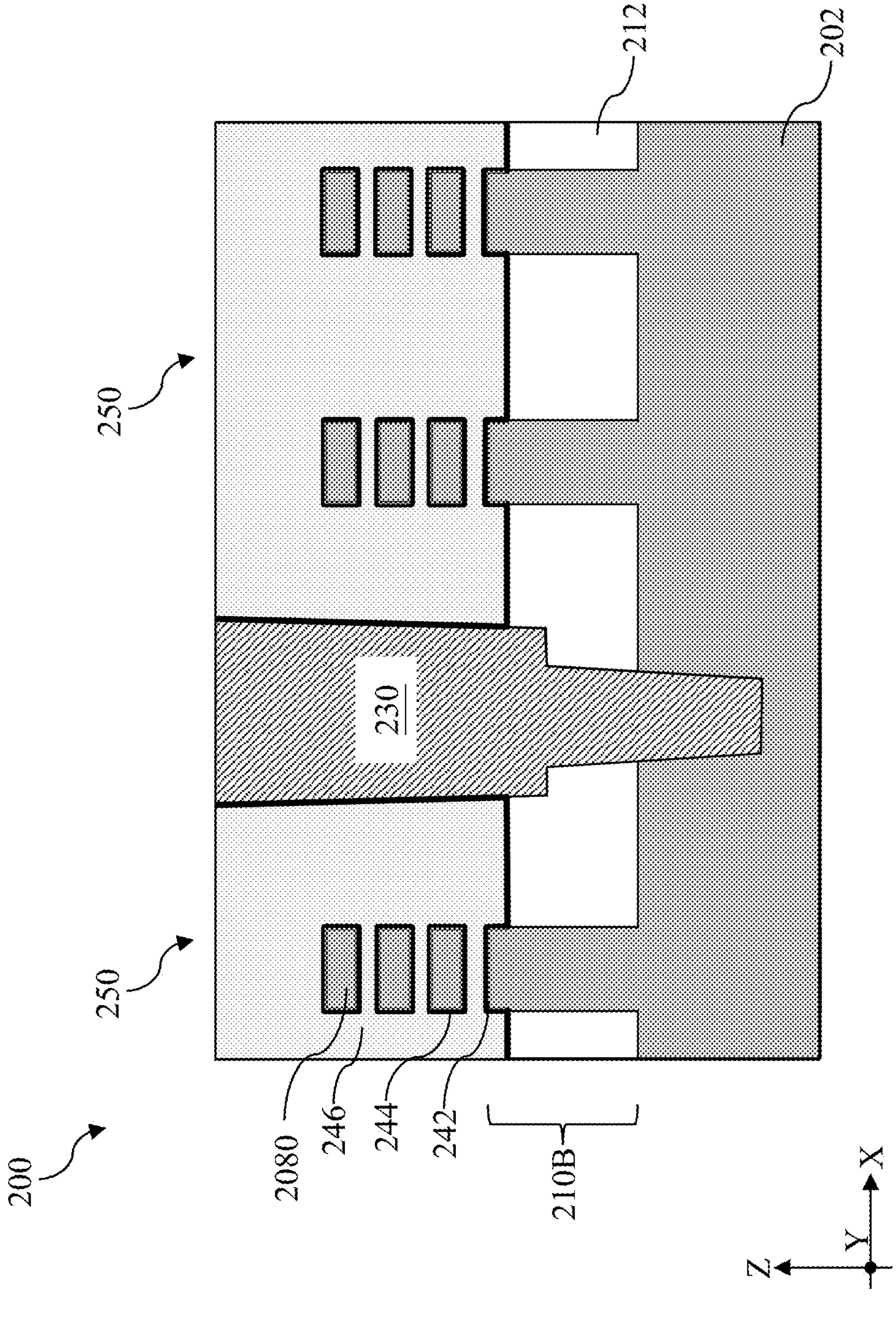

Referring to FIGS. 1 and 12, method 100 includes a block 120 where a gate structure 250 is formed to wrap around each of the channel members 2080. The gate structure 250 may include an interfacial layer 242 on the channel members 2080 and top surfaces of the base portions 210B, a gate dielectric layer 244 over the interfacial layer 242, and a gate electrode layer 246 over the gate dielectric layer 244. In some embodiments, the interfacial layer 242 includes silicon oxide and may be formed as a result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the base portions 210B to form the interfacial layer 242. The gate dielectric layer 244 is then deposited over the interfacial layer 242 using ALD, CVD, and/or other suitable methods. The gate dielectric layer 244 may include high-K dielectric materials. As used herein, high-k dielectric materials include dielectric materials having a high dielectric constant, for example, greater than that of thermal silicon oxide (~3.9). In one embodiment, the gate dielectric layer 244 may include hafnium oxide. Alternatively, the gate dielectric layer 244 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr) $TiO_3$ (BST), silicon nitride (SiN), silicon oxynitride (SiON), combinations thereof, or other suitable material.

After the formation or deposition of the interfacial layer 242 and the gate dielectric layer 244, the gate electrode layer 246 is deposited over the gate dielectric layer 244. The gate electrode layer 246 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD. CVD, e-beam evaporation, or other suitable process.

In various embodiments, a planarization process, such as a CMP process, may be performed to remove excessive materials to provide a substantially planar top surface of the gate structures 250. Referring to FIG. 12, the gate structure(s) 250 wrap around each of the channel members 2080. In FIG. 12, the region isolation feature 230 appears to divide the gate structure 250 include different segments. It is noted that the region isolation feature 230 is not designed or intended to segment gate structures 250. As shown in FIG. 15, the region isolation feature 230 is intended to divide active regions, including the channel members 2080 and the base portions 210B, along the Y direction. As a result, the region isolation feature 230 and the second opening 2260 are not elongated along the Y direction but are more rounded. While in some situations the region isolation feature 230 sufficiently divide the gate structure 250 into insulated gate segments along the X direction, more often than not its downward-tapering shape prevents it from completely sever the dummy gate stack 220 into segments. The leftover dummy gate stack material may later on be replaced with the gate structure material. For that reason, gate cut features 270 (to be described below) are still needed to divide the gate structure 250 into different segments. As shown in FIG. 15, each of the gate cut feature 270 are elongated along the Y direction and such a shape and associated photolithography processes are more effective in dividing up the gate structure 250 in a controlled manner.

Figure 13:
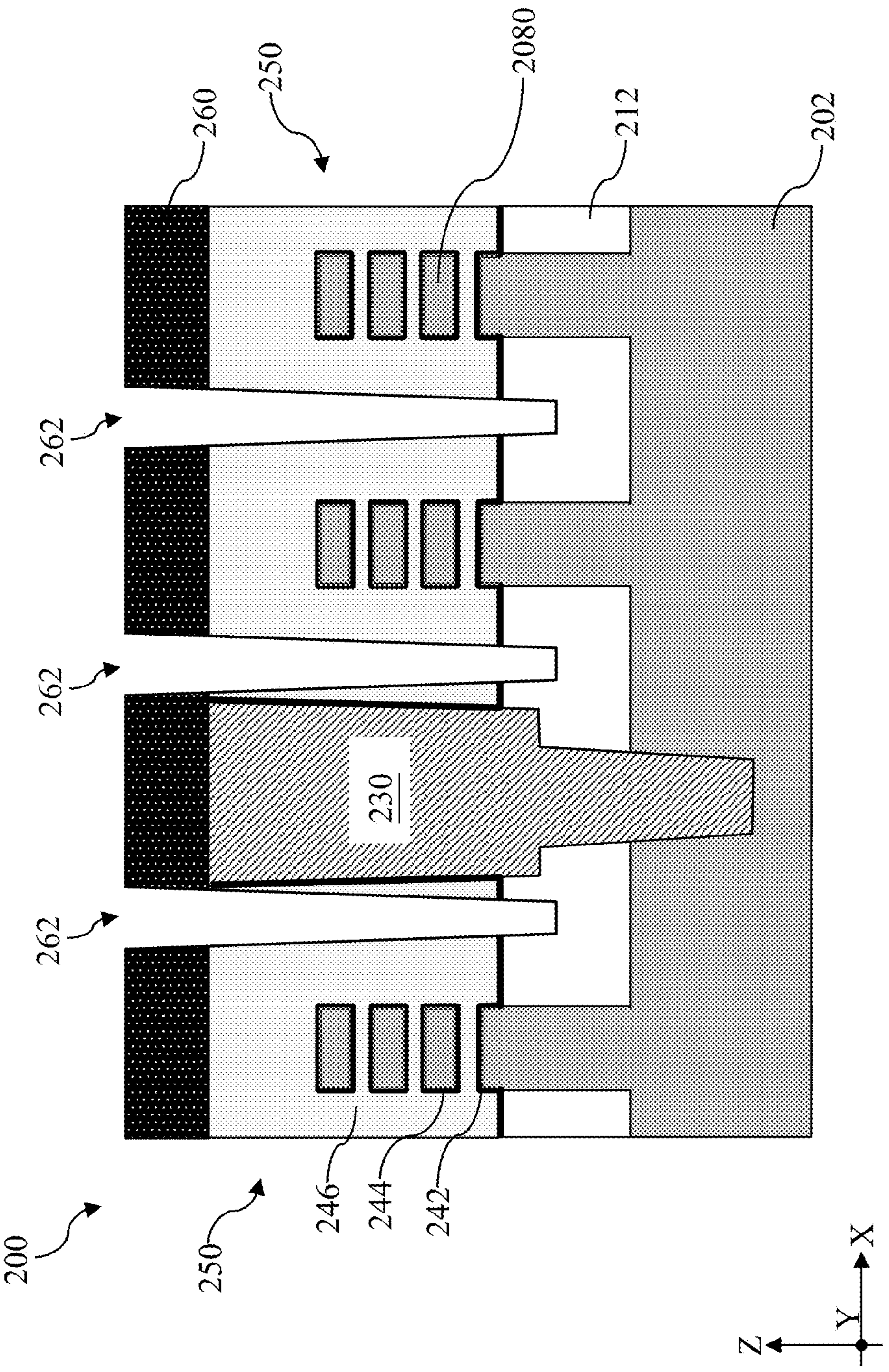
Figure 14:
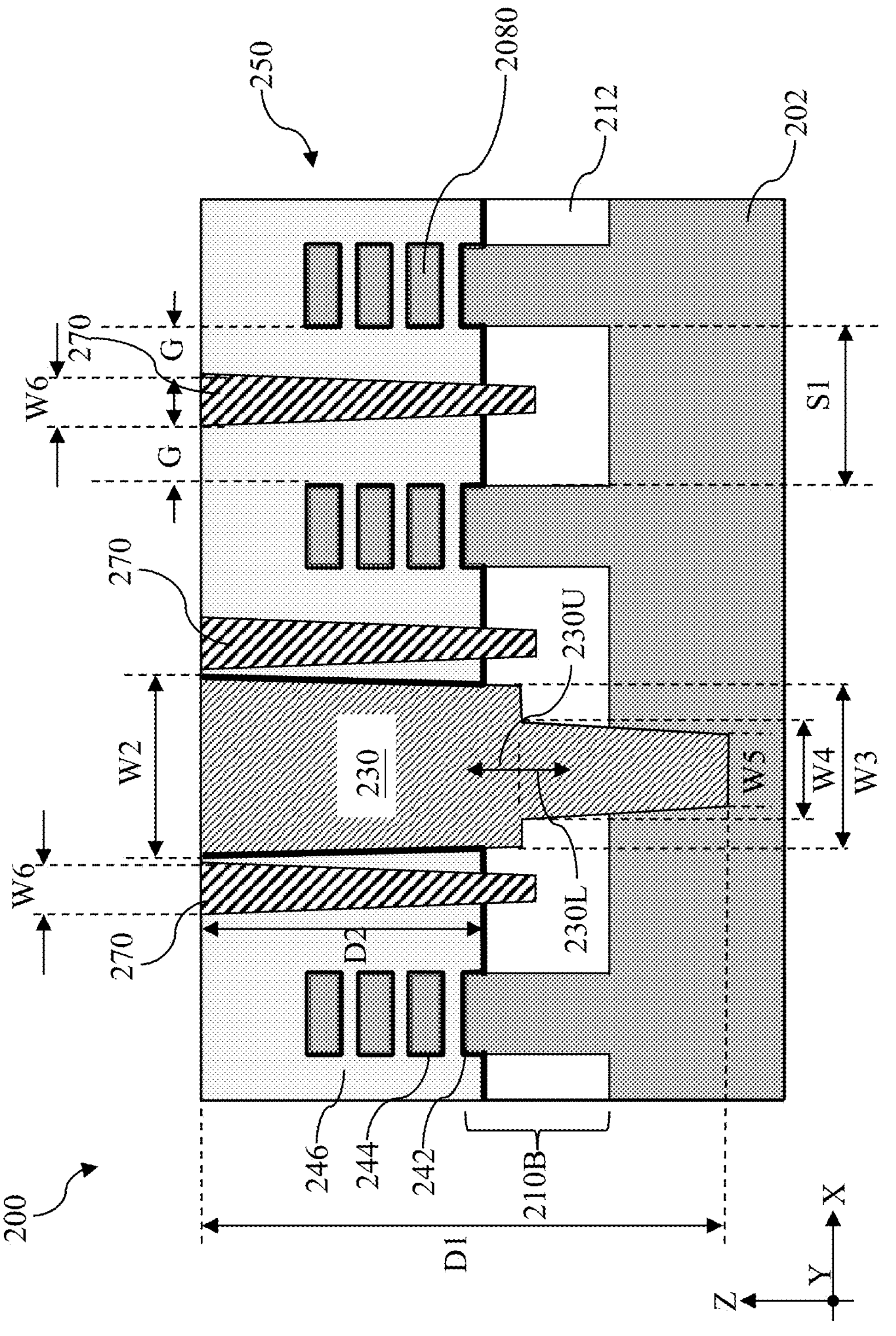
Figure 15:
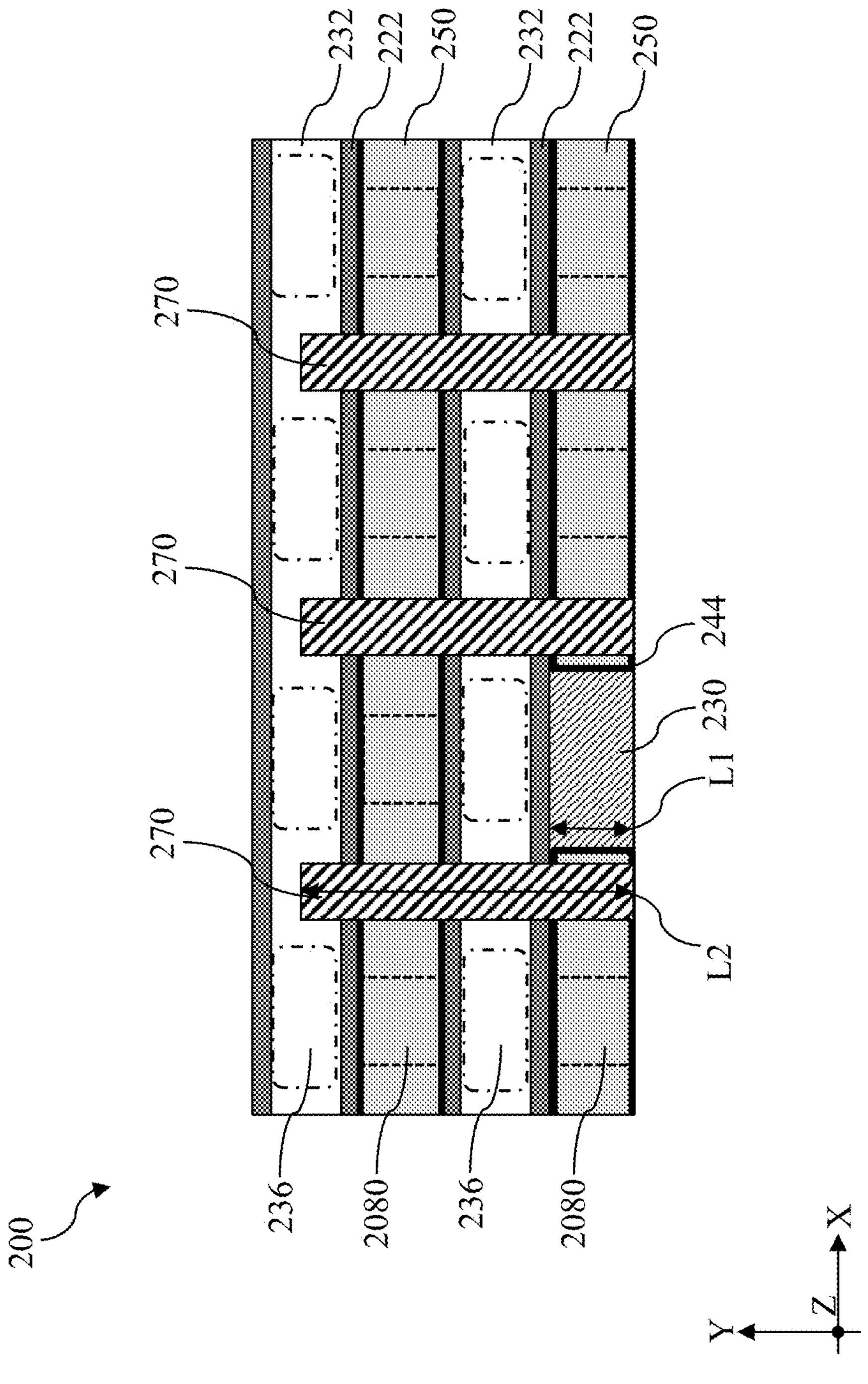

Referring to FIGS. 1 and 13-15, method 100 includes a block 122 where gate cut features 270 are formed. Operations at block 122 may include formation of gate cut openings 262 (shown in FIG. 13) and formation of gate cut features 270 in the gate cut openings 262 (shown in FIGS. 14 and 15). Referring to FIG. 13, to form the gate cut openings 262, a second hard mask layer 260 is deposited over the workpiece 200, including over the gate structures 250. The second hard mask layer 260 may be similar to the first hard mask layer 224 in terms of composition and formation processes. Photolithography processes and etching processes are then performed to pattern the second hard mask layer 260. The patterned second hard mask layer 260 is then used as an etch mask to etch the gate structure 250, the gate dielectric layer 244, and a portion of the isolation feature 212. The etch process to form the gate cut opening 262 may be a dry etch process that includes use of chlorine ($Cl_2$), hydrogen ($H_2$), oxygen ($O_2$), or other chlorine-containing etchant. In some implementations, the etching process applied to form the gate cut openings 262 may include multiple etching steps with etchants more selective to respective gate materials, and may include wet etching, dry etching, or a combination thereof. As shown in FIG. 13, each of the gate cut openings 262 extends completely through the gate structure 250 and into the isolation feature 212. As shown in FIG. 13, each of the gate cut openings 262 tapers downward.

It has been observed that the etching processes for forming the gate cut openings 262 may inevitably etch the gate dielectric layer 244 at a slower rate because of the etch-resistant nature of the high-k dielectric materials. When the gate cut openings 262 vertically overlap with the region isolation feature 230 in any way, the etching may be retarded by the gate dielectric layer 244 disposed along sidewalls of the region isolation feature 230. Such retardation, compounded by different levels of overlapping, may result in uneven depths and shapes of the gate cut openings 262. In turn, segments of the gate structure 250 may have different shapes and width (along the X direction) from the channel members 2080. The variation in shapes and widths in the gate cut openings 262 (and eventually the gate cut features 270) may cause variation in threshold voltages of the transistors, which is undesirable. For the foregoing reasons, a feature of the present disclosure is to ensure that the gate cut openings 262 do not cut into the region isolation feature 230. As shown in FIG. 13, while the gate cut openings 262 may come close to the region isolation feature 230, none of them cuts into the region isolation feature 230. In other words, the gate cut openings 262 are at least spaced apart from the region isolation feature 230 by a portion of the gate electrode layer 246 and a portion of the gate dielectric layer 244.

After the formation of the gate cut openings 262, dielectric materials for the gate cut features 270 are deposited over the gate cut openings 262 by plasma enhanced CVD (PECVD), atomic layer deposition (ALD), low-pressure CVD (LPCVD), or CVD. In some embodiments, the dielectric materials for the gate cut features 270 may include silicon oxide, silicon nitride, silicon oxynitride, silicon oxycarbonitride, or a suitable dielectric material. After the deposition of the dielectric materials for the gate cut features 270, a planarization process, such as a chemical mechanical polishing (CMP) process, may be performed to form the gate cut features 270 shown in FIG. 14 and to remove excess materials, including the patterned second hard mask layer 260. As shown in FIG. 14, like the gate cut openings 262, each of the gate cut features 270 tapers downward.

Reference is still made to FIG. 14. In embodiments where the region isolation feature 230 includes a step change in width, it may be divided into an upper portion 230U above the level where the step change takes place and lower portion 230L below that level. In some embodiments, each of the upper portion 230U and the lower portion 230L tapers downward, albeit with discontinuous sidewalls. The upper portion 230U includes a second width W2 at its top surface and a second width W3 at the interface with the lower portion 230L. The lower portion 230L includes a fourth width W4 at the interface with upper portion 230U and a fifth width W5 at its bottom surface. In some instances, due to the downward tapering, the third width W3 is about 80% to about 95% of the second width W2 and the fifth width W5 is about 80% to about 95% of the fourth width W4. The third width W3 is greater than the fourth width W4. In some instances, a ratio of the fourth width W4 to the third width W3 may be between about 20% and about 100% (where there is no step change). As shown in FIG. 15, each of the gate cut feature 270 may have a sixth width W6 at its top surface. In some embodiments, the sixth width W6 may be between about 10 nm and about 100 nm. In order to ensure that the region isolation feature 230 fits between two adjacent gate cut features 270 without any merger of boundaries, the second width W2 may should be equal to or smaller than as a sum of the first width W1 (shown in FIG. 3) and first spacing S1 (also shown in FIG. 3) minus the sixth width W6. That is, the second width W2 is equal to or smaller than (W1+S1−W6). In any case, the second width W2 cannot be smaller than the first width W1. The region isolation feature 230 extends deeper towards the substrate 202 than the gate cut features 270. In some embodiments, the region isolation feature 230 extends completely through the base portion 210B and well into the substrate 202 while the gate cut feature 270 terminates in the isolation feature 212. In some embodiments, a region isolation feature 230 may have a first depth D1 from its top surface to its bottom surface in the substrate 202 and a gate cut feature 270 may have a second depth D2 from its top surface to its bottom surface in the isolation feature 212. The first depth D1 is greater than the second depth D2. For active regions not affected by the region isolation feature 230, a lateral gate thickness G along sidewalls of the channel members 2080 may be defined as one half of a difference between the first spacing S1 and the sixth width W6 (i.e., G=(S1−W6)/2).

FIG. 15 illustrates a fragmentary top view of the workpiece 200 shown in FIG. 14. As shown in FIG. 15, each of the gate structures 250, whether or not segmented by the gate cut features 270, extends lengthwise along the X direction. Each of the active regions that includes the base portion 210B and the channel members 2080 disposed over the base portion 210B extends lengthwise along the Y direction. In general, the fin-shaped structures 210 may be regarded as a close representation of the active regions. It can be seen that the active regions and the gate structures 250 extend along directions that are perpendicular to one another. Each vertical stack of channel members 2080 extend between and in contact with two source/drain features 236 along the Y direction. The source/drain features 236 are shown in dotted lines because they are at least covered by the ILD layer 232. Along the Y direction, each of the gate structures 250 are sandwiched between two portions of the at least one gate spacer 222. Because the region isolation feature 230 is formed before the formation of the gate structure 250, the gate dielectric layer 244 is disposed along sidewalls of the region isolation feature 230. The gate cut features 270 are formed after the formation of the gate structure 250. As a result, the gate cut features 270 cut through the gate structure 250 but the gate dielectric layer 244 does not extend along sidewalls of the gate cut features 270. In some embodiments represented in FIG. 15, the gate cut features 270 are more elongated along the Y direction than the region isolation feature 230. In FIG. 15, the region isolation feature 230 includes a first length L1 along the Y direction and each of the gate cut features 270 includes a second length L2 along the Y direction. The second length L2 is greater than the first length L1. In some embodiments, a ratio of the second length L2 to the first length L1 is between about 1.5 and about 4.0.

Figure 16:
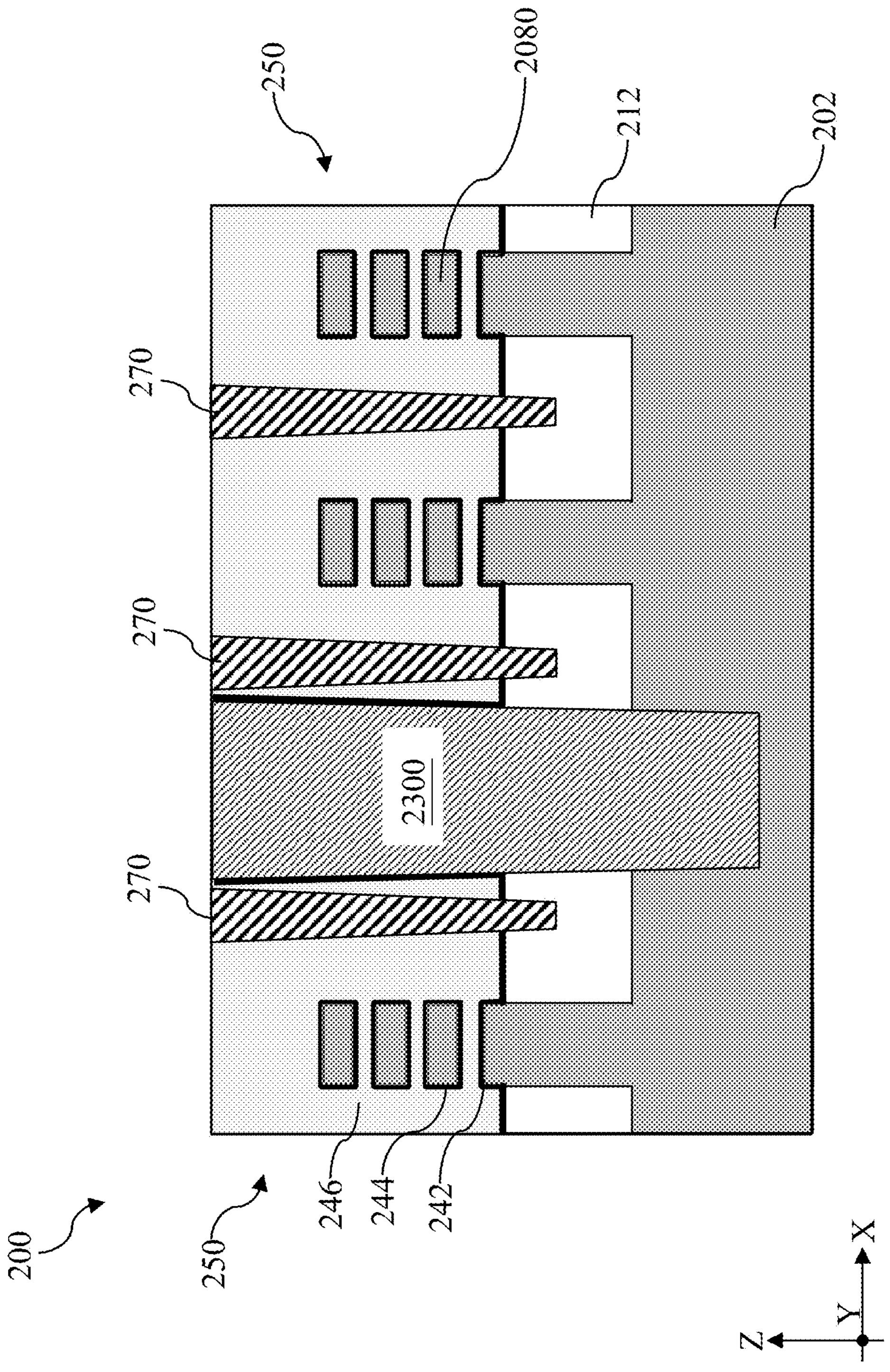
Figure 17:
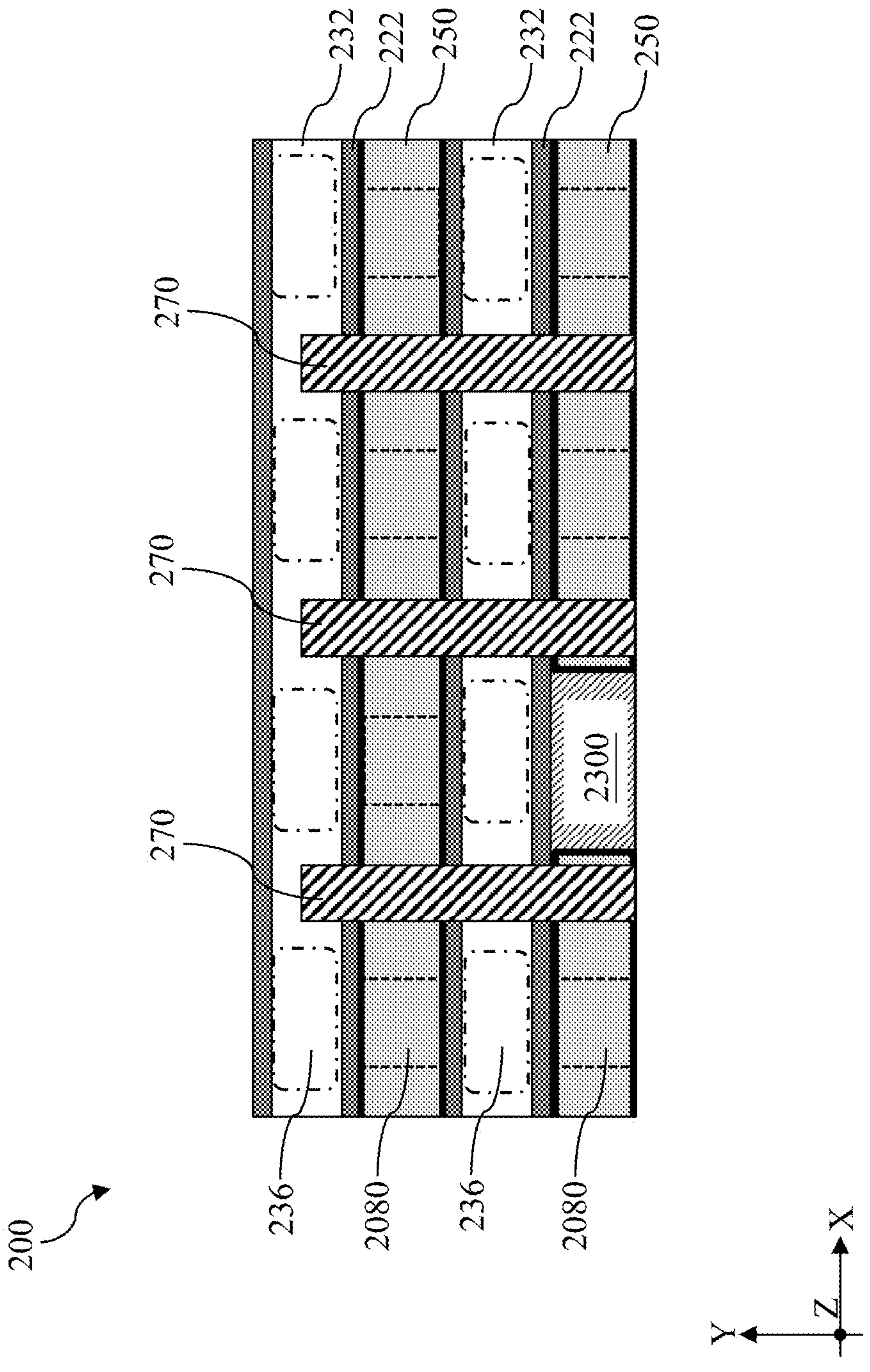

FIGS. 16 and 17 illustrate an alternative embodiment where the dry etching to form the second opening 2260 at block 112 is less selective to the base portion 210B. As a result, a continuous region isolation feature 2300 may be formed. The continuous region isolation feature 2300 is characterized by a continuous sidewall and lack of step change in width. In some embodiments, the continuous region isolation feature 2300 may taper downward in a continuous manner and terminates in the substrate 202.

Despite the continuous sidewalls, none of the gate cut features 270 vertically overlap with the continuous region isolation feature 2300.

Figure 18:
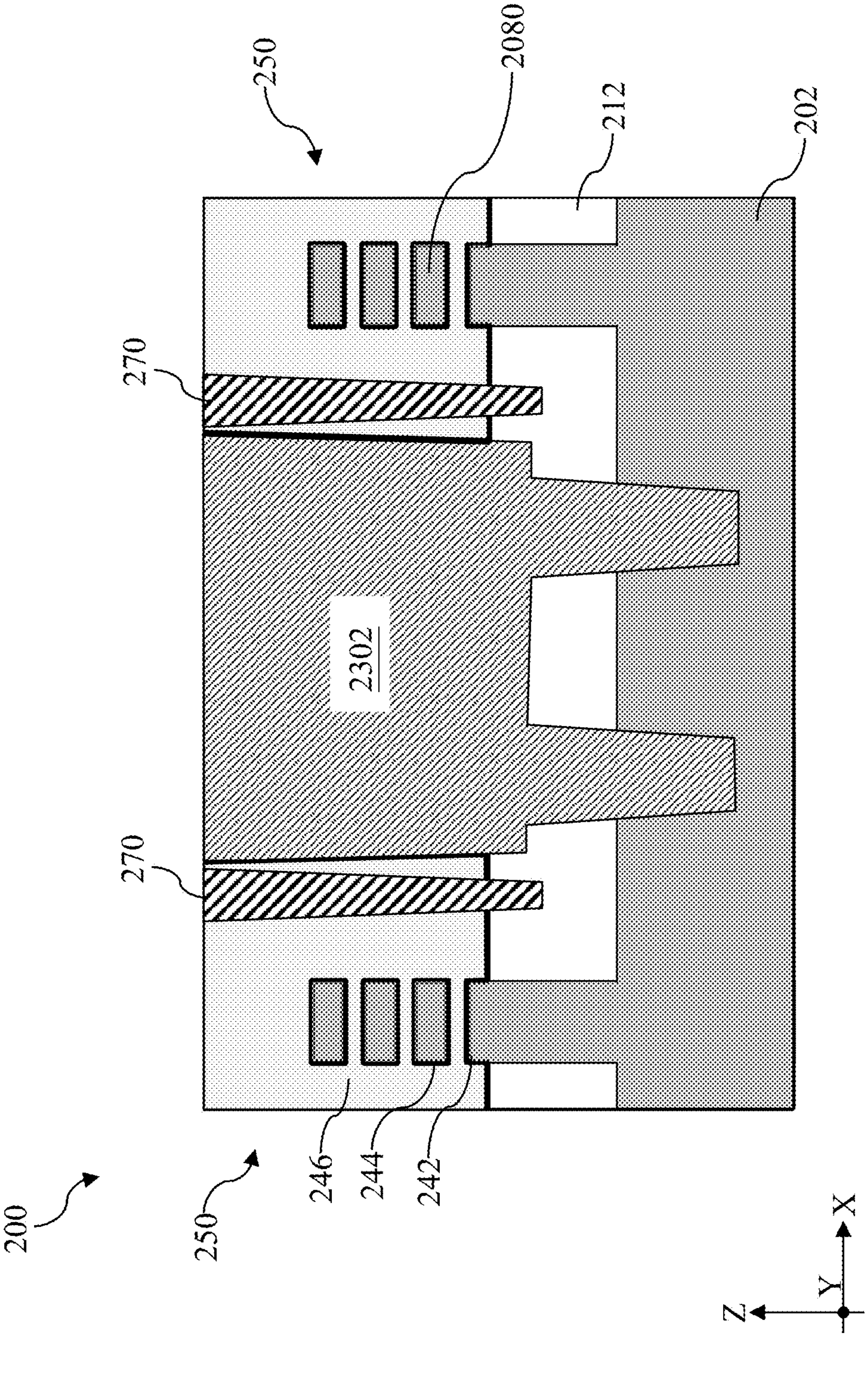
Figure 19:
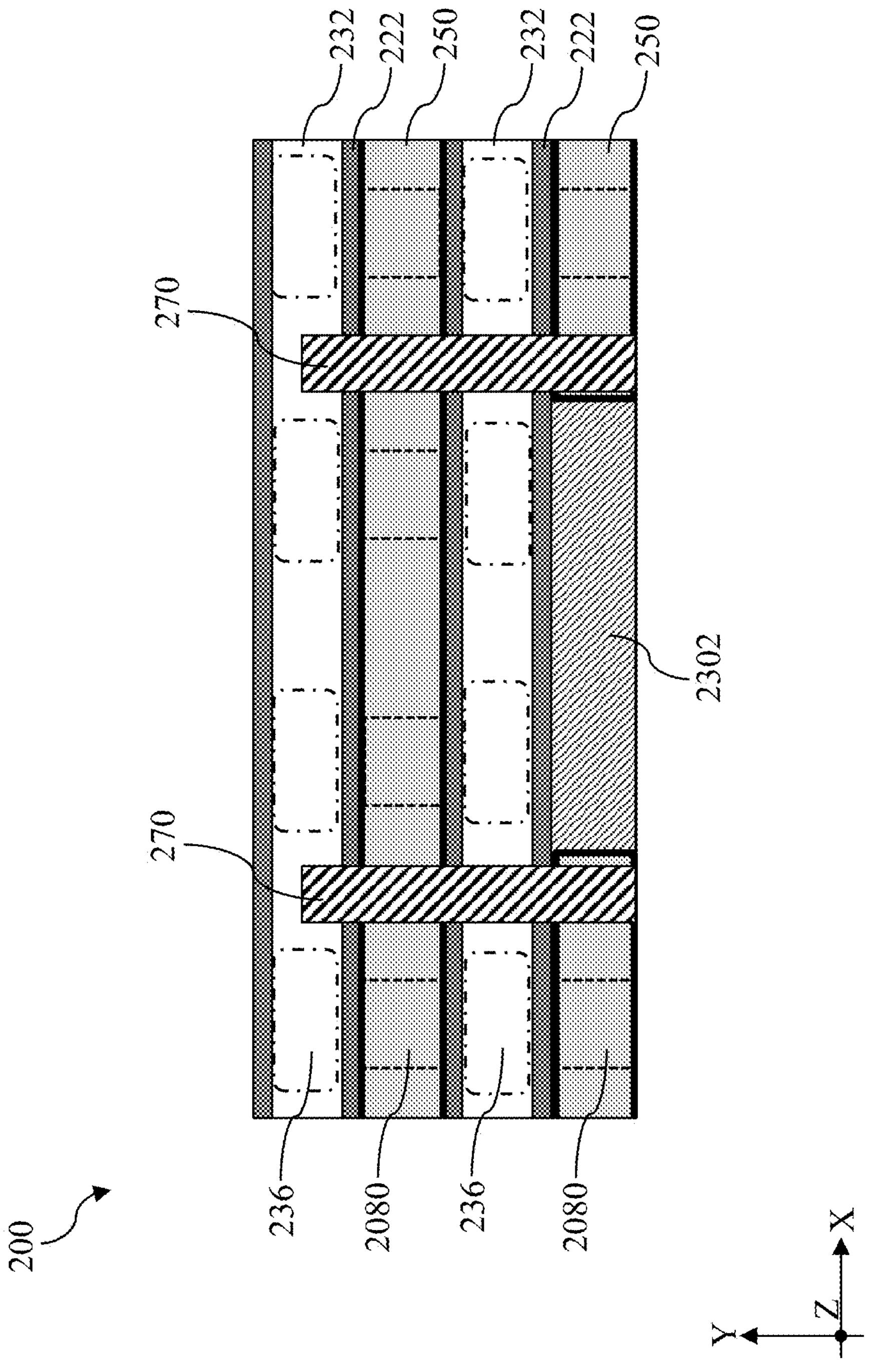

FIGS. 18 and 19 illustrate yet another alternative embodiment where a jumbo region isolation feature 2302 cuts into multiple base portions to separate multiple active regions. While the jumbo region isolation feature in FIG. 18 only spans over two fin-shaped structures 210, it should be understood that the jumbo region isolation feature 2302 may be used to divide more than two fin-shaped structures 210. In some embodiments, the jumbo region isolation feature 2302 may span over between 2 and 10 fin-shaped structures 210.

In one exemplary aspect, the present disclosure is directed to a semiconductor structure. The semiconductor structure includes a substrate, a first base fin and a second base fin arising from the substrate, an isolation structure disposed between the first base fin and the second base fin along a direction, a first plurality of channel members disposed over the first base fin, a second plurality of channel members disposed over the second base fin, a region isolation feature extending through the isolation structure and into the substrate, a first gate structure wrapping around each of the first plurality of channel members, a second gate structure wrapping around each of the second plurality of channel members, a first gate cut feature extending through the first gate structure and into the isolation feature, and a second gate cut feature extending though the second gate structure and into the isolation feature structure. Along the direction, each of the first gate cut feature and the second gate cut feature are spaced apart from the region isolation feature.

In some embodiments, the first gate structure includes a first gate dielectric layer and a first gate electrode layer over the first gate dielectric layer and a portion of the first gate dielectric layer is disposed along a sidewall of the region isolation feature. In some embodiments, the first gate cut feature is in direct contact with the first gate electrode layer. In some implementations, a bottom surface of the region isolation feature is lower than a bottom surface of the first gate cut feature. In some embodiments, the second gate cut feature continuously taper from a top surface of the second gate structure toward the isolation structure. In some embodiments, the region isolation feature includes a lower portion and an upper portion over the lower portion and a width of the region isolation feature along the direction undergoes a step change between the lower portion and the upper portion. In some embodiments, the lower portion tapers downward. In some instances, the upper portion tapers downward.

In another exemplary aspect, the present disclosure is directed to a method. The method includes receiving a workpiece that includes a substrate, a first fin-shaped structure, a second fin-shaped structure, and a third fin-shaped structure arising from a top surface of the substrate, an isolation structure between a lower portion of the first fin-shaped structure and a lower portion of the second fin-shaped structure as well as between the lower portion of the second fin-shaped structure and a lower portion of the third fin-shaped structure, a dummy gate dielectric layer over isolation structure and surfaces of upper portions of the first fin-shaped structure, the second fin-shaped structure and the third fin-shaped structure above the isolation feature, and a dummy gate electrode layer over the dummy gate dielectric layer, forming a first opening through the dummy gate electrode layer, the first opening being directly over the second fin-shaped structure, extending the first opening by etching the dummy gate dielectric layer exposed in the first opening to expose the second fin-shaped structure and etching the second fin-shaped structure to form a second opening, forming a region isolation feature in the second opening, after the forming of the region isolation feature, replacing the dummy gate dielectric layer and the dummy gate electrode layer with a first metal gate structure over the first fin-shaped structure and a second metal gate structure over the third fin-shaped structure, forming a first gate cut opening into the first metal gate structure between the first fin-shaped structure and the region isolation feature, forming a second gate cut opening into the second metal gate structure between the third fin-shaped structure and the region isolation feature, and forming a first gate cut feature and a second gate cut feature into the first gate cut opening and the second gate cut opening, respectively.

In some embodiments, neither of the first gate cut opening and the second gate cut opening cuts into the region isolation feature. In some embodiments, the first opening exposes the dummy gate dielectric layer disposed on the isolation structure. In some implementations, the second opening terminates in the substrate below the second fin-shaped structure. In some embodiments, each of the upper portions of the first fin-shaped structure, the second fin-shaped structure, and the third fin-shaped structure include a stack that includes a plurality of channel layers interleaved by a plurality of sacrificial layers. In some implementations, the replacing includes selectively removing the plurality of sacrificial layers to release the plurality of channel layers as a plurality of channel members. In some instances, the first metal gate structure includes a first gate dielectric layer and a first gate electrode layer over the first gate dielectric layer, the second metal gate structure includes second gate dielectric layer and a second gate electrode layer over the second gate dielectric layer, a portion of the first gate dielectric layer extends along a first sidewall of the region isolation feature, and a portion of the second gate dielectric layer extends along a second sidewall of the region isolation feature, the second sidewall being opposed to the first sidewall. In some embodiments, the forming of the first gate cut opening does not cut into the portion of the first gate dielectric layer that extends along the first sidewall of the region isolation feature and the forming of the second gate cut opening does not cut into the portion of the second gate dielectric layer that extends along the second sidewall of the region isolation feature.

In yet another exemplary aspect, the present disclosure is directed to a method. The method includes receiving a workpiece that includes a substrate, an isolation structure over the substrate, a first active region, a second active region, and a third active region rising from the substrate and extending above the isolation structure, a dummy gate dielectric layer over isolation structure and surfaces of first active region, the second active region and the third active region above the isolation structure, and a dummy gate electrode layer over the dummy gate dielectric layer, forming a first opening through the dummy gate electrode layer to expose the dummy gate dielectric layer over the second active region, extending the first opening by etching the dummy gate dielectric layer exposed in the first opening and etching the second active region to form a second opening, forming a region isolation feature in the second opening, after the forming of the region isolation feature, replacing the dummy gate dielectric layer and the dummy gate electrode layer with a first metal gate structure over the first active region and a second metal gate structure over the third active region, forming a first gate cut feature to extend through the first metal gate structure, the first gate cut feature being disposed between the first active region and the region isolation feature, and forming a second gate cut feature to extend through the second metal gate structure, the second gate cut feature being disposed between the third active region and the region isolation feature. The first gate cut feature and the second gate cut feature are spaced apart from the region isolation feature.

In some embodiments, the first metal gate structure includes a first gate dielectric layer and a first gate electrode layer over the first gate dielectric layer, the second metal gate structure includes second gate dielectric layer and a second gate electrode layer over the second gate dielectric layer, a portion of the first gate dielectric layer extends along a first sidewall of the region isolation feature, and a portion of the second gate dielectric layer extends along a second sidewall of the region isolation feature, the second sidewall being opposed to the first sidewall. In some implementations, the forming of the first opening includes use of chlorine, hydrogen bromide, tetrafluoromethane, hydrogen, nitrogen, oxygen, or carbon dioxide. In some instances, the extending of the first opening includes use of chlorine, hydrogen bromide, tetrafluoromethane, hexafluorobutadiene, hydrogen, nitrogen trifluoride, silicon tetrachloride, carbon dioxide, oxygen, or sulfur dioxide.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a substrate;

a first base fin and a second base fin arising from the substrate;

an isolation structure disposed between the first base fin and the second base fin along a direction;

a first plurality of channel members disposed over the first base fin;

a second plurality of channel members disposed over the second base fin;

a region isolation feature extending through the isolation structure and into the substrate;

a first gate structure wrapping around each of the first plurality of channel members;

a second gate structure wrapping around each of the second plurality of channel members;

a first gate cut feature extending through the first gate structure and into the isolation feature; and a second gate cut feature extending though the second gate structure and into the isolation feature, wherein the first gate cut feature, the region isolation feature, and the second gate cut feature are disposed between the first plurality of channel members and the second plurality of channel members, wherein, along the direction, each of the first gate cut feature and the second gate cut feature are spaced apart from the region isolation feature.

2. The semiconductor structure of claim 1, wherein the first gate structure comprises a first gate dielectric layer and a first gate electrode layer over the first gate dielectric layer, wherein a sidewall of the region isolation feature is spaced apart from the first gate electrode layer by the first gate dielectric layer.

3. The semiconductor structure of claim 2, wherein the first gate cut feature is in direct contact with the first gate electrode layer.

4. The semiconductor structure of claim 1, wherein a bottom surface of the region isolation feature is lower than a bottom surface of the first gate cut feature.

5. The semiconductor structure of claim 1, wherein the second gate cut feature continuously taper from a top surface of the second gate structure toward the isolation structure.

6. The semiconductor structure of claim 1, wherein the region isolation feature comprises a lower portion and an upper portion over the lower portion, wherein a width of the region isolation feature along the direction undergoes a step change between the lower portion and the upper portion.

7. The semiconductor structure of claim 6, wherein the lower portion tapers downward.

8. The semiconductor structure of claim 6, wherein the upper portion tapers downward.

9. A method, comprising:

receiving a workpiece comprising:

a substrate, a first fin-shaped structure, a second fin-shaped structure, and a third fin-shaped structure arising from a top surface of the substrate, an isolation structure between a lower portion of the first fin-shaped structure and a lower portion of the second fin-shaped structure as well as between the lower portion of the second fin-shaped structure and a lower portion of the third fin-shaped structure, a dummy gate dielectric layer over isolation structure and surfaces of upper portions of the first fin-shaped structure, the second fin-shaped structure and the third fin-shaped structure above the isolation feature, and a dummy gate electrode layer over the dummy gate dielectric layer;

forming a first opening through the dummy gate electrode layer, the first opening being directly over the second fin-shaped structure;

extending the first opening by etching the dummy gate dielectric layer exposed in the first opening to expose the second fin-shaped structure and etching the second fin-shaped structure to form a second opening;

forming a region isolation feature in the second opening;

after the forming of the region isolation feature, replacing the dummy gate dielectric layer and the dummy gate electrode layer with a first metal gate structure over the first fin-shaped structure and a second metal gate structure over the third fin-shaped structure;

forming a first gate cut opening into the first metal gate structure between the first fin-shaped structure and the region isolation feature;

forming a second gate cut opening into the second metal gate structure between the third fin-shaped structure and the region isolation feature; and forming a first gate cut feature and a second gate cut feature into the first gate cut opening and the second gate cut opening, respectively.

10. The method of claim 9, wherein neither of the first gate cut opening and the second gate cut opening cuts into the region isolation feature.

11. The method of claim 9, wherein the first opening exposes the dummy gate dielectric layer disposed on the isolation structure.

12. The method of claim 9, wherein the second opening terminates in the substrate below the second fin-shaped structure.

13. The method of claim 9, wherein each of the upper portions of the first fin-shaped structure, the second fin-shaped structure, and the third fin-shaped structure comprise a stack that includes a plurality of channel layers interleaved by a plurality of sacrificial layers.

14. The method of claim 13, wherein the replacing comprises selectively removing the plurality of sacrificial layers to release the plurality of channel layers as a plurality of channel members.

15. The method of claim 9, wherein the first metal gate structure comprises a first gate dielectric layer and a first gate electrode layer over the first gate dielectric layer, wherein the second metal gate structure comprises second gate dielectric layer and a second gate electrode layer over the second gate dielectric layer, wherein a portion of the first gate dielectric layer extends along a first sidewall of the region isolation feature, wherein a portion of the second gate dielectric layer extends along a second sidewall of the region isolation feature, the second sidewall being opposed to the first sidewall.

16. The method of claim 15, wherein the forming of the first gate cut opening does not cut into the portion of the first gate dielectric layer that extends along the first sidewall of the region isolation feature, wherein the forming of the second gate cut opening does not cut into the portion of the second gate dielectric layer that extends along the second sidewall of the region isolation feature.

17. A method, comprising:

receiving a workpiece comprising:

a substrate, an isolation structure over the substrate;

a first active region, a second active region, and a third active region rising from the substrate and extending above the isolation structure, a dummy gate dielectric layer over isolation structure and surfaces of first active region, the second active region and the third active region above the isolation feature, and a dummy gate electrode layer over the dummy gate dielectric layer;

forming a first opening through the dummy gate electrode layer to expose the dummy gate dielectric layer over the second active region;

extending the first opening by etching the dummy gate dielectric layer exposed in the first opening and etching the second active region to form a second opening;

forming a region isolation feature in the second opening;

after the forming of the region isolation feature, replacing the dummy gate dielectric layer and the dummy gate electrode layer with a first metal gate structure over the first active region and a second metal gate structure over the third active region;

forming a first gate cut feature to extend through the first metal gate structure, the first gate cut feature being disposed between the first active region and the region isolation feature; and forming a second gate cut feature to extend through the second metal gate structure, the second gate cut feature being disposed between the third active region and the region isolation feature, wherein the first gate cut feature and the second gate cut feature are spaced apart from the region isolation feature.

18. The method of claim 17, wherein the first metal gate structure comprises a first gate dielectric layer and a first gate electrode layer over the first gate dielectric layer, wherein the second metal gate structure comprises second gate dielectric layer and a second gate electrode layer over the second gate dielectric layer, wherein a portion of the first gate dielectric layer extends along a first sidewall of the region isolation feature, wherein a portion of the second gate dielectric layer extends along a second sidewall of the region isolation feature, the second sidewall being opposed to the first sidewall.

19. The method of claim 17, wherein the forming of the first opening comprises use of chlorine, hydrogen bromide, tetrafluoromethane, hydrogen, nitrogen, oxygen, or carbon dioxide.

20. The method of claim 17, wherein the extending of the first opening comprises use of chlorine, hydrogen bromide, tetrafluoromethane, hexafluorobutadiene, hydrogen, nitrogen trifluoride, silicon tetrachloride, carbon dioxide, oxygen, or sulfur dioxide.

* * * * *